(12) United States Patent
McGinn et al.

(10) Patent No.: US 10,848,811 B2
(45) Date of Patent: *Nov. 24, 2020

(54) CONTROL INFORMATION FOR A WIRELESSLY-TRANSMITTED DATA STREAM

(71) Applicant: Coherent Logix Incorporated, Austin, TX (US)

(72) Inventors: Colleen J. McGinn, Austin, TX (US); Kevin A. Shelby, Austin, TX (US); Peter J. Nysen, San Jose, CA (US); Michael B. Doerr, Dripping Springs, TX (US)

(73) Assignee: Coherent Logix, Incorporated, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/454,651

(22) Filed: Jun. 27, 2019

(65) Prior Publication Data

US 2019/0320218 A1 Oct. 17, 2019

Related U.S. Application Data

(63) Continuation of application No. 15/375,603, filed on Dec. 12, 2016, now Pat. No. 10,425,673, which is a
(Continued)

(51) Int. Cl.
*H04N 7/16* (2011.01)
*H04N 21/266* (2011.01)
(Continued)

(52) U.S. Cl.
CPC .......... *H04N 21/266* (2013.01); *H03M 13/29* (2013.01); *H03M 13/2906* (2013.01);
(Continued)

(58) Field of Classification Search
CPC . H04L 65/40; H04L 65/4069; H04L 65/4076; H04L 65/604; H04L 65/607;
(Continued)

(56) References Cited

U.S. PATENT DOCUMENTS

| 5,235,599 A | 8/1993 | Nishimura |
| 5,325,492 A | 6/1994 | Bonevento |

(Continued)

FOREIGN PATENT DOCUMENTS

| CN | 1402852 A | 3/2003 |
| CN | 1960212 A | 5/2007 |

(Continued)

OTHER PUBLICATIONS

"Digital Video Broadcasting (DVB); Specification for System Software Update in DBV Systems; ETSI TS 102 006" ETSI Standards, LIS, Sophia Antipolis Cedex, France, vol. BC, No. V1.3.1, May 1, 2004, pp. 1-39.

(Continued)

*Primary Examiner* — Ruolei Zong
(74) *Attorney, Agent, or Firm* — Kowert, Hood, Munyon, Rankin & Goetzel, P.C.

(57) ABSTRACT

Control information for configuring an audiovisual device to present multimedia content according to a first service type may be generated. A method may include generating first control information for configuring an audiovisual device to decode a multimedia stream, generating first data that indicates a structure of the first control information, and transmitting the first data and the first control information. The first control information may be generated according to a first protocol version. Second data and second control information may be similarly generated and transmitted according to a second protocol version. Disclosed techniques may facilitate receiving devices to determine whether they support received wireless transmissions and decode the transmissions based on the control information.

20 Claims, 28 Drawing Sheets

Related U.S. Application Data continuation of application No. 14/618,250, filed on Feb. 10, 2015, now Pat. No. 9,560,403, which is a continuation of application No. 13/906,135, filed on May 30, 2013, now Pat. No. 8,984,159, which is a continuation of application No. 12/479,423, filed on Jun. 5, 2009, now Pat. No. 8,489,762, which is a continuation-in-part of application No. 12/167,708, filed on Jul. 3, 2008, now Pat. No. 8,151,305.

(60) Provisional application No. 61/131,165, filed on Jun. 7, 2008, provisional application No. 60/948,185, filed on Jul. 5, 2007, provisional application No. 60/958,585, filed on Jul. 5, 2007, provisional application No. 60/999,039, filed on Oct. 14, 2007.

(51) Int. Cl.

| | | |
|---|---|---|
| H04L 29/06 | (2006.01) | |
| H03M 13/29 | (2006.01) | |
| H04N 21/61 | (2011.01) | |
| H04N 21/438 | (2011.01) | |
| H04N 21/2381 | (2011.01) | |
| H03M 13/00 | (2006.01) | |
| H04N 21/236 | (2011.01) | |
| H03M 13/11 | (2006.01) | |
| H03M 13/27 | (2006.01) | |

(52) U.S. Cl.
CPC ... *H03M 13/2909* (2013.01); *H03M 13/2957* (2013.01); *H03M 13/6583* (2013.01); *H04L 65/4076* (2013.01); *H04L 65/604* (2013.01); *H04L 65/607* (2013.01); *H04L 69/18* (2013.01); *H04N 21/2381* (2013.01); *H04N 21/23605* (2013.01); *H04N 21/4381* (2013.01); *H04N 21/6112* (2013.01); *H04N 21/6131* (2013.01); *H03M 13/1102* (2013.01); *H03M 13/2732* (2013.01); *H03M 13/2936* (2013.01)

(58) Field of Classification Search
CPC ... H04L 69/18; H03M 13/29; H03M 13/2906; H03M 13/2909; H03M 13/2957; H03M 13/6583; H03M 13/1102; H03M 13/2732; H03M 13/2936; H04N 21/266; H04N 21/23605; H04N 21/2381; H04N 21/4381; H04N 21/6112; H04N 21/6131
USPC ......................................... 709/236
See application file for complete search history.

(56) References Cited

U.S. PATENT DOCUMENTS

| | | | |
|---|---|---|---|
| 6,192,399 | B1 | 2/2001 | Goodman |
| 7,251,218 | B2 | 7/2007 | Jorgensen |
| 7,526,289 | B2 | 4/2009 | Schwarz et al. |
| 8,111,694 | B2* | 2/2012 | Pohjolainen ........... H04H 60/25 370/392 |
| 2003/0207696 | A1 | 11/2003 | Willnegger et al. |
| 2004/0101046 | A1 | 5/2004 | Yang et al. |
| 2005/0081254 | A1 | 4/2005 | Carlson et al. |
| 2005/0193408 | A1 | 9/2005 | Sull et al. |
| 2006/0045099 | A1 | 3/2006 | Chang |
| 2006/0053450 | A1* | 3/2006 | Saarikivi .......... H04N 21/43637 725/46 |
| 2006/0056405 | A1 | 3/2006 | Chang |
| 2006/0111110 | A1 | 5/2006 | Schwartz et al. |
| 2006/0123099 | A1* | 6/2006 | Paila ..................... H04L 69/18 709/219 |
| 2006/0209745 | A1 | 9/2006 | MacMullan et al. |
| 2006/0242091 | A1* | 10/2006 | Jansky ................ H04N 7/163 706/15 |
| 2006/0262651 | A1 | 11/2006 | Cooper et al. |
| 2007/0005795 | A1 | 1/2007 | Gonzalez |
| 2007/0053291 | A1 | 3/2007 | Hiltunen et al. |
| 2007/0064707 | A1 | 3/2007 | Pandel et al. |
| 2007/0091168 | A1 | 4/2007 | Lee |
| 2007/0147440 | A1 | 6/2007 | Song et al. |
| 2007/0180467 | A1* | 8/2007 | Lee .......................... H04N 7/52 725/39 |
| 2007/0239886 | A1 | 10/2007 | Montemayor et al. |
| 2008/0043821 | A1 | 2/2008 | Brockhage |
| 2008/0126549 | A1 | 5/2008 | Khanchandani et al. |
| 2008/0320526 | A1 | 12/2008 | Franceschini et al. |
| 2009/0013356 | A1 | 1/2009 | Doerr et al. |
| 2009/0193487 | A1 | 7/2009 | Simon |

FOREIGN PATENT DOCUMENTS

| | | |
|---|---|---|
| CN | 101095342 A | 12/2007 |
| JP | 11187378 A | 7/1999 |
| JP | 2003134075 A | 5/2003 |
| WO | 2002003678 A3 | 1/2002 |
| WO | 2006010373 A1 | 2/2006 |
| WO | 2007046677 A1 | 4/2007 |
| WO | WO 2009/006593 A2 | 1/2009 |

OTHER PUBLICATIONS

Organisation Internationale Normalisation, ISO/IEC JTC 1/SC 29/WG 11, "Coding of Moving Pictures and Audio", Source: MPEG-4 Systems, Title: Study Text of @D2,0 ISO/IEC 144496-1:2002—Chapters 14-17, Editors: Kim, Michelle (IBM), et al, May 2002, pp. 1-102.

European Search Report in Appln. No. 12150157.1 dated Mar. 14, 2012, 9 pgs.

ETSI TS 102 006 V1.3.1—Digital Video Broadcasting (DVB); Specification for System Software Update in DVB Systems; European Broadcasting Union; May 1, 2005; 40 pgs.

Partial International Search Report for Application No. PCT/US2009/046466; dated Nov. 11, 2009; 9 pages.

Advanced Television Systems Committee, "A/53: ATSC Digital Television Standard, Parts 1-6, 2007", Jan. 2007, Advanced Television Systems Committee, www.atsc.org/standard/a53-atsc-digital-television-standard/ (Year: 2007).

International Search Report and Written Opinion for Application No. PCT/US2008/069200, dated Feb. 18, 2010; 15 pgs.

International Search Report and Written Opinion for Application No. PCT/US2009/046560, dated Dec. 8, 2009; 16 pgs.

"Annex D: RF/Transmission Systems Characteristics"; Digital Television Standard; XP-002187665; Sep. 16, 1995; 16 pgs.

A. Touzhi, H. Fu, M. Fimoff, and W. Bretl; "Enhanced 8-VSB Transmission for North-American HDTV Terrestrial Broadcast"; ICASSP 2003; Apr. 6, 2003; 4 pages.

"ATSC Digital Television Standard Part 2—RF/Transmission System Characteristics (A/53, Part 2:2007)", Advanced Television Systems Committee; Jan. 3, 2007; 44 pgs.

"Modulation and Coding Requirements for Digital TV (DTV) Applications Over Satellite—ATSC Standard"; Advanced Television Systems Committee; Jul. 17, 1999; 33 pgs.

International Search Report and Written Opinion for PCT/US2009/045487, dated Oct. 29, 2009; 17 pgs.

Jill M. Boyce; "Packet loss resilient transmission of MPEG video over the Internet"; Signal Processing: Image Communication 15 (1999), pp. 7-24.

Mugen Peng and Wenbo Wang, "A Unified Architecture and Key Techniques for Interworking between WiMAX and Beyond 3G/4G Systems"; Oct. 2, 2007; pp. 67-90.

Office Action dated Sep. 5, 2019 in CN Appln. No. 200880105340. 3, 22 pgs.

Office Action dated Apr. 30, 2015 in EP Appln. 08772417.5, 6 pgs.

Office Action dated Jun. 26, 2012 in JP Appln. No. 2010-515275, 5 pgs.

(56) References Cited

OTHER PUBLICATIONS

"Digitial Video Broadcasting (DVB); IP Datacase over DBV-H: Electronic Service Guide (ESG)" European Broadcasting Union, Union Europeenne de Radio-Television; ETSI TS 102 471 ETSI Standards, lis, Sophia Antipolis Cedex, France, vol. BC, No. V1.2.1, Nov. 1, 2006, 82 pgs.

Matthew Gast: "A Peek Ahead at 802.11n: MIMO-OFDM", Wireless Networks: The Definitive Guide, Second Edition: Jan. 11, 2007, pp. 311-342.

"ATSC Standard: Program and System Information Protocol for Terrestrial Broadcast and Cable (Revision C) With Amendment No. 1"; Advanced Television Systems Committee; Jan. 2, 2006 (155 pages).

"EST TS 102 471 V1.2.1—Digital Video Broadcasting (DVB); IP Datacast Over DVB-H: Electronic Service Guide (ESG)"; European Broadcasting Union; Nov. 1, 2006 (82 pages).

"A Peek Ahead at 802.11n: MIMO-OFDM"; XP-002414302; Jan. 11, 2007 (32 pages).

"Broadcast and On-line Services: Search, select, and rightful use of content on personal storage systems ("TV-Anytime"); Part 3: Metadata; Sub-part 2: System aspects in a uni-directional environment; ETSI TS 102 822-3-2"; IEEE, Lis, Sophia Antipolis Cedex, France, vol. BC, No. V1.4.1; Nov. 1, 2007; XP014040518, ISSN: 0000-0001 (73 pages).

EXPWAY: "A streamable XML binary encoding for TV Anytime metadata", TV Anytime Meeting; May 6, 2001-Aug. 6, 2001; Seattle; ftp://ftp.bbc.co.uk; No. AN282; May 29, 2001; XP030095590 (18 pages).

Joerg Heuer et al: "Results of the mini experiments for binary MPEG-7 data representation (BiM)"; MPEG Meeting; May 3, 2001-Sep. 3, 2001; Singapore; (Motion Pictureexpert Group or ISO/IEC JTC1/SC29/WG11); No. M7024, Mar. 3, 2001, XP030036154, ISSN: 0000-0285 (33 pages).

Open Mobile Alliance: "OMA Device Management Tree and Description", Draft Version 1.2.1, May 22, 2008; XP55020891 (48 pages).

\* cited by examiner

| Field Name | Bits | Description |
|---|---|---|
| Header | 4 | Version number for Extensible Control Language (XCL) |
| Length | 8 | Length of the packet body in bytes. The packet body is defined as the fields starting after the packet length field and ending with the last byte of the packet. |
| Fragment Number | 4 | Number of fragments in XCL packet starting at 0001, 0000 is special value indicating no fragmentation used. |
| Service Descriptor | N | Descriptor for mapping the versioned signaling stream to services referenced by service identifier (IP address), major channel number, ... |
| Command | 4 + ext | Command 4 bits in length plus extension if signaled. |
| Modifier | 4 + ext | Modifier, special data field. Length is 4*specified number of fields plus extensions per field. |
| Data | 4 + ext | Data as specified by command. Length is 4*specified number of fields plus extensions per field. |
| CRC 16 | 16 | Cyclic Redundancy Check, calculated over the entire length of the packet. |

FIG. 11

| Service Descriptor Type | Service Descriptor Length | NumColumns | Column Length | Column Type | Data |
|---|---|---|---|---|---|
| 4 | 4 | 4 | 4 | 4 | 4 |

FIG. 12

| Field Name | Bits | Description |
|---|---|---|
| Service Descriptor Type | 4 + ext | Used to version the Service Descriptor. Legacy radios may be taught to ignore all Service Descriptors with types they do not recognize. |
| Service Descriptor Length | 4 + ext | Specifies length of Service Descriptor in nibbles. |
| NumColumns | 4 + ext | Specifies the number of columns in the table, which equates to the number of ColumnType/Data sets to follow. |
| Column Length | 4 + ext | Number of items in the columns. All columns may be the same length. |
| Column Type | 4 + ext | Enumerated information type, to be defined for each version of the standard. Example types would include Version number, Stream ID, IP Address, Major Channel Number, Minor Channel Number. |
| Data | 4 + ext | Data, size specified per Column Type parameter. |

FIG. 13

| Field Name | Number of Bits | Value |
|---|---|---|
| Service Descriptor Type | 4 | 0000 |
| Service Descriptor Length | 4 | 1011 (nibbles) |
| NumColumns | 4 | 0011 |
| Column Length | 4 | 0001 |
| Column Type | 4 | 0000= Version Number |
| Data | 4 | 0001 |
| Column Type | 4 | 0001= Major Channel Number |
| Data | 4 | 0100 |
| Column Type | 4 | 0010=Offset vector (nibbles) |
| Data | 8 | 00010000 |

FIG. 14

| Field Name | Bits | Description |
|---|---|---|
| Command | 4+ext | Command to be performed. |
| Length | 4+ext | Length of the command payload in bytes. The command payload is defined as the fields starting after the command length field and ending with the last byte of the packet. |
| Navigation | 4+ext | Variable number of nibbles specifying the parameter location. Last nibble in navigation fields specifies the leaf on the tree where the parameter(s) are loaded. |
| Parameters | N | Single or multiple parameter values (parameter group) located at a leaf location on the tree. |

FIG. 15

| Command/Data | Value | Command | Interpretation |
|---|---|---|---|
| 0 | 000 | Node | Data to follow specifies a node (4 bits+ext) plus a leaf or just a leaf, and a parameter selection (4 bits+ext). Command may be used for navigation and/or the setting of a parameter. |
| 0 | 001 | Modifier | Data to follow specifies a modifier ID (4 bits+ext) and a modifier value (4 bits+ext), value applies to all nodes below the current one. |
| 0 | 010 | Descend | Descend N levels in tree from current node. For each level to descend there is a data field specifying the node per level. Example Start node 1.0 descend 2 levels ->1.12. The command would have the following bits designated 0111 (command). Current node is 1, 1001 (first node below is 1,1), 1010 (second node below first is 1,1,2). |
| 0 | 011 | Ascend | Ascend N levels in tree from current node, next field (4 bits+ext.) specifies number of levels to ascend. (Return path is reversal of most recent descending path). |
| 0 | 100-110 | Reserved | Reserved for future use. |
| 0 | 111 | CFE | Command field is extended |
| 1 | 000 | Data | Data field, value = 0 |
| 1 | 001 | Data | Data field, value = 1 |
| 1 | 010 | Data | Data field, value = 2 |
| 1 | 011 | Data | Data field, value = 3 |
| 1 | 100 | Data | Data field, value = 4 |
| 1 | 101 | Data | Data field, value = 5 |
| 1 | 111 | Data | Data field, value = 6 |

FIG. 16

| Value | Modifier | Interpretation |
|---|---|---|
| 1000 | Subversion | All nodes below current are of version specified in data field to follow, added as a decimal number ($1/10^{th}$) to the current Base Version, (version 1.2 is subversion of 1.0) Ex. 2 is signaled in data field, Base Version is 1.0, Subversion is then 1.0 + .2=1.2. |
| 1001 | Exception | All nodes below current are exception to most recent modifier, (i.e. if most recent modifier is Default, than nodes below have non default values.) It is possible to specify and exception to an exception. |
| 1010 | Optional | All nodes below current are optional, service can be supported without support for optional nodes. |
| 1011 | Replicate | Single or multiple parameter values (parameter group) located at a leaf location on the tree. |
| 1100-1110 | Reserved | Additional Modifier parameter values reserved for future use. |
| *1111* | Extended | Modifier table is extended |

Set data parameter at leaf 0.0.0
(FIC Chunk Header (table))
Current Node location = 0.0

Ascend to node location 0
(root)

Set data parameter (table) at
0.1.0.0 (FIC Segment Payload
Header)
Current Node location = 0.1.0

Ascend to node location 0.1

Set service data at leaf 0.1.1.0
Current Node location = 0.1.1

Set service data at leaf 0.1.1.1
Current Node location = 0.1.1

| Cmd= 'Node' | Length | Node value= '1000' | Leaf value= '1000' | FIC Chunk Header |
|---|---|---|---|---|
| 4 | 4 | 4 | 4 | 24 or 32 Bits per field |

| Cmd = 'Ascend' | NumLevels = '1001' |
|---|---|
| 4 | 4 |

| Cmd= 'Node' | Length | Node value= '1001' | Node value= '1000' | Leaf value= '1000' | Ensemble Header |
|---|---|---|---|---|---|
| 4 | 4 | 4 | 4 | 4 | 24 or 32 |

| Cmd = 'Ascend' | NumLevels = '1001' |
|---|---|
| 4 | 4 |

| Cmd= 'Node' | Length | Node value= '1001' | Leaf value= '1000' | Service Loop Data |
|---|---|---|---|---|
| 4 | 4 | 4 | 4 | 24 or 48 |

| Cmd= 'Node' | Length | Leaf value= '1000' | Service Loop Data |
|---|---|---|---|
| 4 | 4 | 4 | 24 or 48 |

| Header XCL ver = '0000' | Length | Fragment Number | Service Descriptor | Cmd= 'Version' | Data = '1001' |
|---|---|---|---|---|---|
| 4 | 8 | 4 | N | 4 | 4 |

*Start Base Version 1.0 group ('0x1001') Default node location = 0 (Root)*

| Cmd= 'Node' | Node value= '1000' | Leaf value= '1000' | SMT Table Header |
|---|---|---|---|
| 4 | 4 | 4 | 88 |

*Set data parameter at leaf 0.0.0 -> 0x0200 Current Node location = 0.0*

| Cmd = 'Ascend' | NumLevels = '1001' |
|---|---|
| 4 | 4 |

*Ascend to node location 0 (root)*

| Cmd= 'Node' | Node value= '1001' | Node value= '1000' | Leaf value= '1000' | SMT Service Loop Header |
|---|---|---|---|---|
| 4 | 4 | 4 | 4 | 168/360 |

*Set data parameter (table) at 0.1.0.0 Current Node location = 0.1.0*

| Cmd= 'Node' | Node value= '1001' | Node value= '1000' | Component Header |
|---|---|---|---|
| 4 | 4 | 4 | 16 |

*Set data parameter (table) at 0.1.0.1.0.0 Current Node location = 0.1.0.1.0*

| Cmd= 'Node' | Leaf value= '1001' | Video Descriptor Header |
|---|---|---|
| 4 | 4 | 24 |

*Set data parameter (table) at 0.1.0.1.0.1 Current Node location = 0.1.0.1.0*

| Cmd= 'Node' | Leaf value= '1010' | Component Type 35 Payload |
|---|---|---|
| 4 | 4 | 24 |

*Set data parameter at leaf 0.1.0.1.0.3 Current Node location = 0.1.0.1.0*

| Cmd= 'Modifier' | Optional= '1101' | Cmd= 'Node' | Leaf value= '1010' | Component Type 100 Payload |
|---|---|---|---|---|
| 4 | 4 | 4 | 4 | 24 |

*Set data parameter at leaf 0.1.0.1.1.3 Current Node location = 0.1.0.1.1*

| Cmd = 'Ascend' | NumLevels = '1001' |
|---|---|
| 4 | 4 |

*Ascend 1 level to Node location = 0.1.0.1*

| Cmd= 'Node' | Node value= '1010' | Leaf value= '1000' | Component Header |
|---|---|---|---|
| 4 | 4 | 4 | 16 (reduced) |

*Set data parameter (table) at 0.1.0.1.2.0 Current Node location = 0.1.0.1.2*

| Cmd= 'Node' | Leaf value= '1001' | Audio Descriptor Header |
|---|---|---|
| 4 | 4 | 48 |

*Set data parameter (table) at 0.1.0.1.2.1 Current Node location = 0.1.0.2.0*

| Cmd= 'Node' | Leaf value= '1010' | Component Type 36 Payload |
|---|---|---|
| 4 | 4 | 64 |

*Set data parameter at leaf 0.1.0.1.2.2 Current Node location = 0.1.0.1.2*

| Cmd= 'Modifier' | Optional= '1101' | Cmd= 'Node' | Node value= '1011' | Leaf value= '1000' | Decoder Config Record Loop |
|---|---|---|---|---|---|
| 4 | 4 | 4 | 4 | 4 | Num_Loops(32+config_size*8*8) |

*Set data parameter at leaf 0.1.0.1.2.3.0 Current Node location = 0.1.0.1.2.3*

FIG. 23

| Command/Data | Value | Command | Interpretation |
|---|---|---|---|
| 0 | 000 | Base Version | Data to follow specifies a base version, value applies to all fields to follow (version group) until either next version specifier command or end of version group command is encountered. This command partitions the XCL stream by version. (i.e. commands in version group are all ATSC M/H version 1.0 compliant.) |
| 0 | 001 | Node | Data to follow specifies a node (4 bits+ext) plus a leaf or just a leaf, and a parameter selection (4 bits+ext). Command may be used for navigation and/or the setting of a parameter. |
| 0 | 010 | Modifier | Data to follow specifies a modifier ID (4 bits + ext.) and a modifier value (4 bits + ext.), value applies to all nodes below the current one. |
| 0 | 011 | Length | Data to follow specifies a length in bytes (4 bits + ext), a leaf location (Node ID), and length bytes of data. (Used for specification of pure data values rather than enumerated selections.) |
| 0 | 100 | Descend | Descend N levels in tree from current node. For each level to descend there is a data field specifying the node per level. Example: Start node 1.0, descend 2 levels -> 1.1.2. The command would have the following bits designated 0111 (command), Current node is 1, 1001 (first node below is 1.1), 1010 (second node below first is 1.1.2). |
| 0 | 101 | Ascend | Ascend N levels in tree from current node, next field (4 bits + ext.) specifies number of levels to ascend. (Return path is reversal of most recent descending path). |
| 0 | 110 | EOVG | End of version group specifier |
| 0 | 111 | CFE | Command field is extended |
| 1 | 000 | Data | Data field, value = 0 |
| 1 | 001 | Data | Data field, value = 1 |
| 1 | 010 | Data | Data field, value = 2 |
| 1 | 011 | Data | Data field, value = 3 |
| 1 | 100 | Data | Data field, value = 4 |
| 1 | 101 | Data | Data field, value = 5 |
| 1 | 110 | Data | Data field, value = 6 |
| 1 | 111 | Data | Data field is extended by 4 bits, value = next value + 7 |

FIG. 24

| Value | Modifier | Interpretation |
|---|---|---|
| 1000 | Subversion | All nodes below current are of version specified in data field to follow, added as a decimal number (1/10$^{th}$) to the current Base Version. (version 1.2 is subversion of 1.0) Ex. 2 is signaled in data field, Base Version is 1.0, Subversion is then 1.0 + .2 = 1.2. |
| 1001 | Default | All nodes below current have default parameters specified (defaults set per version). |
| 1010 | Mandatory | All nodes below current are not backwards compatible to base version. Backwards compatibility assumed unless specified otherwise. (Base version of version 1.2 is 1.0.) |
| 1011 | Exception | All nodes below current are exception to most recent modifier. (i.e. if most recent modifier is Default, than nodes below have non default values.) It is possible to specify and exception to an exception. |
| 1100 | Pad | Bits added to pad length as needed. Padding ends when next command is detected. Bits are set to '1' and '0' in alternating fashion. Used to realign commands/data/modifiers to nibble boundaries after the use of a Length command. |
| 1101 | Optional | All nodes below current are optional, service can be supported without support for optional nodes. |
| 1110 | Replicate | All nodes below the current node have the same values as the node specified in the following data fields. Used with exception command to specify similar nodes efficiently. |
| 0111 | Extended | Modifier table is extended |

*FIG. 25*

CONTROL INFORMATION FOR A WIRELESSLY-TRANSMITTED DATA STREAM

PRIORITY CLAIM

This application is a continuation of U.S. application Ser. No. 15/375,603 filed Dec. 12, 2016; which is a continuation of U.S. application Ser. No. 14/618,250 filed Feb. 10, 2015; which is a continuation of U.S. application Ser. No. 13/906,135 titled "Bit-Efficient Control Information for use with Multimedia Streams", filed on May 30, 2013, now U.S. Pat. No. 8,984,159 issued Mar. 17, 2015; which is a continuation of U.S. application Ser. No. 12/479,423 titled "Transmitting and Receiving Control Information for use with Multimedia Streams, filed on Jun. 5, 2009, now U.S. Pat. No. 8,489,762 issued Jul. 16, 2013; which claims benefit of priority to provisional application Ser. No. 61/131,165 titled "Enhanced Mobile TV System with Extensibility" filed on Jun. 7, 2008, and which is a continuation-in-part of U.S. application Ser. No. 12/167,708 titled "Mobile Television Broadcast System" filed on Jul. 3, 2008, now U.S. Pat. No. 8,151,305 issued on Apr. 3, 2012; which claims benefit of priority to provisional application Ser. No. 60/948,185 tiled "Robust Mobile TV Broadcast System" filed Jul. 5, 2007, Ser. No. 60/958,585 titled "Robust Mobile TV Broadcast System" filed Jul. 5, 2007, and Ser. No. 60/999,039 titled "Robust Mobile TV Broadcast System" filed Oct. 14, 2007, all of which are hereby incorporated by reference in their entirety as though fully and completely set forth herein.

FIELD OF THE INVENTION

The present disclosure relates to configuring a communication system, and more specifically in one embodiment to a reconfigurable method for signaling configuration information.

DESCRIPTION OF THE RELATED ART

In traditional communication systems, the format of the data and control streams can only be changed in predefined ways. A few bits are reserved for adding functionality, a few enumerated parameters support multiple options, but overall the changes supported are very limited. The developers add this limited flexibility to the system in places they think are likely to change. There are two types of changes needed that cannot be planned for; unforeseen problems with the system and new technology innovations. Support for indeterminate change requires forwards compatibility.

Flexible, extensible methods of structuring data have been invented to address the need for a data and control protocol that can evolve over time, but they have limitations. Such languages include XML, JSON and YAML. These languages structure data in a tree based format, which is advantageous for extensibility, but can require significant overhead if not carefully designed for bit efficiency. The format of the XML and related protocols is text based to support human readability. This allows the data to be human readable, but burdens the language with excessive overhead. In communication systems, bandwidth efficiency is highly desirable. A much more efficient method of extensible communication is needed.

The ATSC (Advanced Television Systems Committee) standard relates to a digital television format which will replace the analog NTSC television system. The ATSC standard is a high definition television standard that produces standard 4:3 or wide screen 16:9 images up to 1920×1080 pixels in size—more than six times the display resolution of the earlier NTSC standard. The ATSC standard makes provisions to transport multiple standard-definition "virtual channels" broadcast on a single 6 MHz TV channel. The ATSC standard also includes "theater quality" audio using the Dolby Digital AC-3 format to provide 5.1-channel surround sound. The ATSC standard also provides numerous auxiliary datacasting services. Improvements are needed in the signaling and versioning of the ATSC standard.

SUMMARY

Embodiments of the invention relate to a system and method for generating control information for use in transmission with a multimedia stream to an audiovisual device. Embodiments of the invention also relate to a system and method for receiving and presenting multimedia content according to received control information. Embodiments of the invention may be used with digital mobile broadcast television, as well as provision of digital multimedia content to various mobile/handheld devices, such as cell phones, smart phones, etc.

In a transmission embodiment, the method generates one or more groups (e.g., a plurality of groups) of control information. Each group of control information is for configuring the audiovisual device to present a multimedia stream. Each group of control information may be generated according to a different protocol version. Further, each group of control information may be for configuring the audiovisual device to present the multimedia stream in a different manner.

The method may also generate a first data structure (which may be referred to as a service descriptor). The first data structure comprises location information of each group of control information. The first data structure may also specify the protocol version for each group of control information. Locations of each of the plurality of groups of control information may be based on protocol version and/or service type. The first data structure may be configured to be extensible, e.g., to add additional information which relates to additional control information. For example, additional control information may be added to accommodate future standard changes, or new standards, and the first data structure can be extended accordingly to include information regarding this new control information. Also, additional data structures (service descriptors) may be included in subsequent transmissions to accommodate additional control information.

The information contained in the first data structure is useable by receiving audiovisual devices to determine which control information is compatible with the audiovisual device, and which control information should be ignored.

The method may then generate and transmit a first plurality of packets, the first plurality of packets comprising the first data structure, the plurality of groups of control information, and a multimedia stream. Here the "transmission" of packets includes broadcast transmission of packets, such as in a wireless broadcast television system. The "transmission" of packets also includes provision of packets from a server computer to a client (e.g., a mobile device) over a network, such as the Internet.

The first data structure may be used by the audiovisual device to ignore one or more respective groups of control information if the audiovisual device is not configured to understand the protocol version(s) of the one or more respective groups of control information.

In a reception embodiment, an audiovisual device may receive a first plurality of packets, wherein the first plurality of packets comprise a first multimedia stream, first control information, second control information and a first data structure. The packets may be received in a wired or wireless manner.

The first data structure (e.g., service descriptor) comprises location information for the first control information and the second control information. The first data structure also specifies a first protocol version of the first control information and a second protocol version of the second control information.

The audiovisual device analyzes the first data structure to determine the location information for the first control information and the second control information, and the first and second protocol versions of the first control information and the second control information. Where the audiovisual device is not configured to understand the second protocol version, the audiovisual device uses the location information of the second control information to ignore the second control information.

The audiovisual device then configures itself according to the first control information, thus enabling the audiovisual device to present the first multimedia stream. The audiovisual device may then present the first multimedia stream after being configured.

The control information, which is provided to the audiovisual device for configuring the audiovisual device to present a multimedia stream, may be organized according to a tree data structure having a plurality of nodes, wherein at least some of the nodes are leaf nodes. The leaf nodes store data values for configuring the audiovisual device. The control information may comprise a plurality of commands. At least some of the commands are executable by the audiovisual device to navigate the nodes of the tree structure to locate the data values stored at the leaf nodes. Certain of the commands may be executable to navigate the tree structure relative to a current position in the tree structure. Alternatively, or in addition, certain of the commands may be executable to navigate the tree structure relative to a root node of the tree structure. One or more of the commands may be a modifier command. The modifier command may specify a parameter value for all leaf nodes below a current node position in the tree data structure. For example, the modifier command may specify that all data values below the current node position in the tree data structure are optional data values, or are mandatory values. Some of the leaf nodes may each store a plurality of data values for configuring the audiovisual device.

In one embodiment, the control information comprises a plurality of commands, wherein at least a subset of the commands have associated data fields. One or more of the commands may be a modifier command including a length value and which specifies a parameter value applied to all data values within a length distance from the modifier command specified by the length value. For example, the modifier command may specify that all data values within the length distance from the modifier command specified by the length value are optional data values, or are mandatory values.

Embodiments of the invention may utilize various bit efficiencies to more efficiently generate the control information. For example, the control information may comprise a plurality of commands, wherein at least a subset of the commands has associated data fields. Each of the commands may comprise a plurality of bit portions of a uniform length. Also, each of the data fields may comprise a plurality of bit portions having uniform length. In one embodiment, a first bit (such as the MSB) of the bit portions of the commands may have a first value (e.g., a "0") indicating that the bit portion is a command. A first bit (such as the MSB) of the bit portions of the data fields may have a second value (e.g., a "1") indicating that the bit portion is a data field, wherein the second value is different than the first value. This provides an efficient way to indicate length of commands and data, without requiring a dedicated length field.

In one embodiment, the transmission system receives (or generates) instructions to modify the system (transmission/receive) configuration. Alternatively, or in addition, the transmission system determines channel characteristics of the wireless communication medium and then determines a modification to the system (transmission/receive) configuration based on the current channel characteristics. The transmission system may be configured to modify its own configuration, e.g., by modifying parameter values in one or more communication layers in the transmission system. The transmission system may correspondingly also generate control information to dynamically configure corresponding communication layers in the receivers of various mobile devices. The modification to the configuration of the transmission/receive system may comprise modifications to various operational characteristics of the transmission system/receiver, such as video codec used, audio codec used, image resolution, the amount and/or type of forward error correction, receive parameters, multiplexing arrangement, etc. The transmission/receive system may thus be modified to dynamically configure the system based on the channel characteristics of the wireless communication medium and/or based on received instructions.

The transmission system may examine current parameters of a plurality of the communication layers and determine the system modifications (modifications to the transmit and receive logic) based on these parameters. As noted above, the system modifications may comprise modifying a first communication layer in the transmit/receive system, or a plurality of the communication layers. In one embodiment, when the transmission system receives an instruction or otherwise makes a determination to modify parameters in a first communication layer, the transmission system may examine parameters of various of the communication layers and determine modifications to other parameters in the first communication layer and/or modifications to parameters in other communication layers.

Thus, the transmission system is configured to adjust one or more of a plurality of the "communication layers" in the transmission system/receiver, including the Physical layer as well as the higher layers, such as the Management layer and Presentation layer. In one embodiment, the modifications may include modifying a plurality of the communication layers, e.g., two or more of the communication layers. The communication layer modifications may be generated based on parameter values of a plurality of the communication layers, or may be generated to improve or optimize operation across the plurality of communication layers. The methods thus provide for "cross layer control" as described herein.

The transmission system generates and transmits packets to the receiver over the communication medium, the packets containing audiovisual information as well as control information. The packets containing audiovisual information may comprise one or more digital television channels intended for devices, including mobile devices. As noted above, the transmission system generates packets according to the ATSC (Advanced Television Standards Committee)

DTV (digital television) standard containing one or more digital television channels intended for stationary receivers (e.g., televisions), and generates packets containing one or more digital television channels intended for mobile/handheld (M/H) receivers. Generation of the packets containing audiovisual information may comprise various steps, such as encoding the audio and video data (e.g., using MPEG-2 encoding), applying forward error correction, generating appropriate packet headers and control information, etc.

The control information may be comprised in packets that use an otherwise unassigned packet ID (uPID). The control information may be useable to dynamically reconfigure operation of the mobile devices, e.g., dynamically configure communication layers operating in the mobile devices. As noted above, the control information may be configured to dynamically configure operation of the mobile devices based on changes made in the transmission system.

The control information may utilize a command structure that is known both on the transmit side and the receive side. The command structure may be organized as a hierarchical tree. Thus the commands comprised in the control information may be configured to modify parameters stored according to a hierarchical tree structure in the receiver, wherein the hierarchical tree structure represents the receiver (and transmission system) configuration. This hierarchical tree structure is discussed in greater detail below.

The hierarchical tree structure may also allow for new nodes to be added to the tree after deployment of transmission and receiver systems, where the new nodes add new functionality in the system. Thus the transmit method may generate the control information configured to modify the hierarchical tree structure in the receiver to provide extended (new or modified) functionality in the receiver. The transmission method may also operate to transmit version information or some other characteristic of the services, where the version information or other characteristic can be used to group control information into subgroups of services supported by various generations of radios. The transmission method may further include descriptors or modifiers that can be applied across sets of nodes to more efficiently specify parameter values in the tree. The transmission method may also include a table describing the services offered by version or by some other parameter(s), coupled with an offset into the control information or some other method of vectoring to the location in the control information where the control stream that supports the listed service is located.

In one embodiment, the transmission system provides information to the receiver to configure the receiver regarding how to receive the packets, e.g., the ordering of the packets in the transmitted data stream. Once the packet ordering is established, the method may subsequently only send delta information to the receiver regarding changes in the ordering of transmitted packets.

More specifically, transmission of the packets may comprise transmitting a first plurality of packets comprising audiovisual information intended for mobile devices (first stream), a second plurality of packets comprising control information (second stream), and a third plurality of packets comprising standard digital television signals intended for stationary televisions (third stream). The standard digital television signals may not be useable by the mobile device. In another embodiment, the standard digital television signals may be received, processed and presented by the mobile device(s). Transmission of these plurality of packets may comprise multiplexing the first, second, and third plurality of packets (multiplexing the first, second and third streams). Multiplexing of these different packets or streams may be performed in a systematic way based on a ratio of the relative bandwidth allocations of the respective pluralities of packets (or streams). In one embodiment, multiplexing these different packet streams comprises ordering the packets to distribute them evenly according to their relative bandwidth. This method will be referred to as continuous mode. In another embodiment, known as burst mode, the packet content associated with each stream (first, second and third) is sent in aggregated bursts where the start of each burst is indicated as part of the control information. The multiplexing may operate to reduce transmission overhead.

In one embodiment, the transmission method transmits size information regarding the bandwidth allocations of the various packet streams, wherein the size information is useable at the receiver to derive the systematic multiplexing arrangement employed by the receiver and in accordance with the multiplexing arrangement demultiplex the received packet streams. In other words, the receiver may use the knowledge of the size information to "know" how to properly demultiplex the received packets. This concept of systematic multiplexing can be applied to both the continuous and burst mode cases.

Mobile devices are configured to receive the packets transmitted by the transmission system, including the packets containing audiovisual information and the packets containing control information. The receiver then operates to demultiplex the received packets in a systematic manner complementary to that employed by the transmitter in multiplexing the packet streams, e.g., based on received size information as mentioned above. The receiver in the mobile device (e.g., each mobile device) is then configured based on the received commands contained in the control information. In other words, the mobile device extracts commands from the received packets and configures its operation according to these commands. The commands contained in the control information may be executed to modify operation of one or more communication layers in the receiver (e.g., to match the communication layer changes made in the transmission system). Thus a respective mobile device is configured to use the control information to configure its operation during reception and/or presentation of the received audiovisual information.

For example, if the control information specifies use of a specific video codec and/or audio codec, the receiver in the mobile device is configured according to the indicated video codec and/or audio codec. As another example, if the control information specifies use of a certain amount of forward error correction, the receiver in the mobile device is configured to decode received data based on the amount of indicated forward error correction. As another example, if the control information specifies use of a certain display resolution, the receiver is modified to produce the indicated display resolution.

The receiver in the mobile device processes packets containing audiovisual information based on its configuration. Thus the receiver processes subsequently received packets according to the changes made to the one or more communication layers. In other words, the various communication layers in the receiver (as previously modified) operate to process audiovisual data in subsequently received packets.

The mobile device then presents audiovisual information on its display based upon the received and processed packets. Thus the mobile device may operate according to its configuration (per the received control information) to process the received information and present the received audiovisual information on its display.

In one embodiment, the receiver in the mobile device transmits feedback information back to the transmission system. The receiver in the mobile device may transmit the feedback information back to the transmission system over any of various mediums, e.g., a return path, such as a cellular network or WAN/WAP, etc. The feedback information may comprise various types of information, such as packet error rates, packet loss information, receiver capabilities, user settings, etc. The transmission system may then use this feedback information in determining how to adjust the broadcast system, e.g., which parameters to adjust in one or more of the communication layers in the transmission/receive systems.

In another embodiment, the receiver in the mobile device may also transmit control information to the transmission system to configure the transmission system. For example, the receiver obtain various information, such as packet error rates, user input, etc., and may reconfigure itself (by changing one or more parameters in one or more communication layers in the receiver). The receiver may then generate control information (in a similar manner in which the transmission system generates control information) and provide this control information to the transmission system. The transmission system may then receive this control information and modify its capabilities accordingly, e.g., modify one or more parameters in one or more communication layers in the transmission system.

Thus in one embodiment of the broadcast system, the transmission system is capable of modifying its configuration and transmitting information to the receiver in at least one mobile device to modify its configuration, and the receiver in at least one mobile device is capable of modifying its configuration and transmitting information to the transmission system to modify its configuration.

BRIEF DESCRIPTION OF THE DRAWINGS

A better understanding of the present disclosure can be obtained when the following detailed description of the preferred embodiment is considered in conjunction with the following drawings, in which:

FIG. 11 is a table defining the fields of a control packet according to one embodiment;

FIG. 12 is an illustration of the format of the service descriptor field according to one embodiment;

FIG. 13 is a table defining the sub-fields of the service descriptor field according to one embodiment;

FIG. 14 is a table illustrating an exemplary service descriptor field according to one embodiment;

FIG. 15 is an illustration of the format of a series of commands/data according to one embodiment;

FIG. 16 is a table defining an XCL command set according to one embodiment;

FIG. 17 is a table defining XCL command set modifiers according to one embodiment;

FIG. 22 is an illustration depicting a SMT data tree for use with the ATSC M/H tree in FIG. 19 according to one embodiment;

FIG. 23 is an illustration depicting an exemplary command sequence navigating an SMT tree according to one embodiment;

FIGS. 24 and 25 are tables defining alternate embodiments of an XCL command set and command modifiers;

Figure 1:
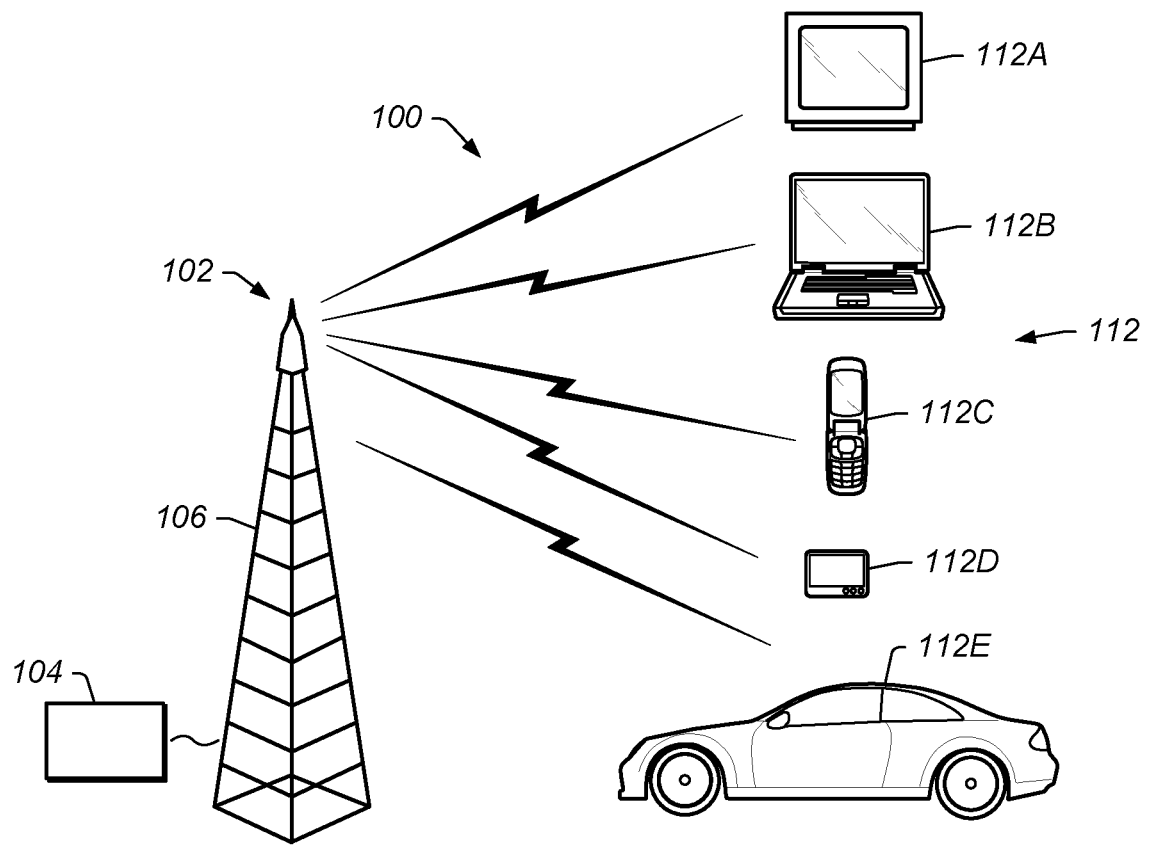
FIG. 1 illustrates a digital television broadcast system according to one embodiment.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

A communication system, such as a broadcast system, may typically include a framework for communicating some sort of content or service(s). A communication system may additionally include a signaling framework to provide information to receivers about the content or service(s). Any communication system with even minimal complexity or which may be expected to change over time may need to provide such information to enable a receiver to use the content or service(s); for example, a signaling framework may enable a receiver to tune to an offered service, to extract the service from the transport, and present it to a user. One specific example of a communication system is an audiovisual broadcast system, e.g., a digital television broadcast system. Many of the embodiments described herein may be illustrated in light of such an exemplary system, although the embodiments may also be applicable to other communication systems.

Signaling may include information on specific components which may be useful or necessary for a receiver to use a service Signaling may also include versioning information.

One or more components of the system (at any level of the system, up to and including the entire system) may include a protocol version. A receiver may need to know such versioning information in order for it to reconstruct a service correctly. For example, if a service is constructed at a transmitter with a version of functionality newer than the current functionality installed on the receiver, the receiver may not be able to process the service and present it correctly. The version information for the functionality involved in the processing and presentation of the service may therefore need to be included in the signaling information. Because bandwidth in a communication system may be limited, it may also be important that the signaling framework be efficient, e.g., in order to preserve as much bandwidth as possible for the actual content and/or service(s).

The signaling framework and methodology used in a given communication system will have a significant effect on the forward and backward compatibility of present and future implementations of the communication system. A particularly desirable feature for a communication system is to be able to provide for older (legacy) devices and services while at the same time being able to provide new services and devices capable of supporting the new services. The most effective way to efficiently provide this backward compatibility in new services (e.g., to develop new services and devices which can operate alongside legacy devices and services) may be to build a signaling framework that is very forward compatible (e.g., that is designed to efficiently and effectively provide for indeterminate change to the communication system, including in the signaling framework itself). Thus, using a flexible, extensible, and efficient signaling framework can be critical to improving the overall functionality of a communication system as well as extending the useful lifespan of components (e.g., services offered and consumer components for receiving those services) of the communication system.

Various embodiments of the present invention relate to such a framework and methodology which may produce a flexible, extensible, and efficient versioning and signaling system for a communication system. One key to such a framework may be to provide a way for legacy receivers to gracefully recognize if they can't support a portion of the signaling/version data and ignore or skip such portions of the signaling/versioning data. This allows more freedom in the development of new services and receivers which can support those new services without crippling a legacy receiver's ability to receive content.

There may be several components to such a framework which may each be implemented in various ways. Some or all of these components may work together to produce an extensible and efficient signaling and versioning framework. In some embodiments, one or more of the components may be implemented individually, e.g., without the other components, although in some embodiments, greater benefit may be derived from using some or all of the components together. The components may include any of the following, each of which will be described further below. There may be a means for structuring the signaling/versioning data such that the insertion of unsupported data in the structure can be detected and skipped gracefully by legacy receivers. There may be a means of partitioning the signaling/versioning data into compatible groups, such that targets of these groups (e.g., receivers) may support the functionality grouped. There may be a means of indexing into these signaling/versioning groups such that receivers are supported in accessing only the data required to decode and correctly present a supported service, and so that they may know in advance of attempting to present content, that the presentation of the content is fully supported. There may be a means for determining how much data is to be skipped if some portion is unsupported. There may be a means for navigating or otherwise referencing the structure of the signaling/versioning data such that the structure of data can be amended and/or extended. There may be a means for extending the means of navigating or otherwise referencing the structure of the signaling/versioning data.

Structuring the signaling/versioning data such that the insertion of unsupported data in the structure can be detected and skipped gracefully by legacy receivers means that the structure includes, for each portion of the structure which is likely to be modified independently of any other portions of the structure, an element that signals to receivers (i.e., including legacy receivers) whether or not they are able to support that portion of the structure. Effectively, there must be a way to mark different portions of the structure by version. This may be done in a number of ways. One implementation involves structuring the signaling/versioning data in a tree format, where any given leaf or node (e.g., including one or more leaves and/or sub-nodes) may be versioned individually. Another implementation includes structuring the signaling/versioning data in one or more tables, where each portion of a table has a header or a pointer which directly or indirectly marks the version of that portion of the signaling/versioning data. In addition, the structure itself should be extensible, that is, there must be a way to insert additional signaling/versioning data. A tree structure lends itself easily to this additional requirement, as additional nodes or leaves can be created without affecting the remainder of the structure. A table may also be able to accommodate this requirement.

Partitioning the signaling/versioning data into compatible groups, such that targets of said groups may support the functionality grouped, may increase the efficiency of the signaling framework. Examples of such groupings could include protocol version of a given standard, class of service, audio/visual information type, standard type, etc. For example, if the signaling/versioning data is partitioned into protocol version groups, a receiver compatible up to a particular protocol version may get all of the signaling/versioning data for that protocol version from a single group.

Indexing into the signaling/versioning groups may allow a receiver to find a group which it supports, and conversely, to recognize groups which it cannot support, and thus ignore them. As compared to forcing a receiver to begin parsing the signaling/versioning data itself in order to discover whether or not that data is supported, this may be a much more efficient way for a receiver to discover which portion(s) of the signaling/versioning data are relevant to and supported by that particular receiver. One exemplary implementation of such an index is a 'service descriptor' or a 'service discovery table', e.g., a data structure separate from the signaling/versioning data, which provides such indexing information. Another possible implementation is to include such indexing information within the signaling versioning data, although this may provide less flexibility for future changes to the signaling framework itself.

If a receiver is to skip or ignore unsupported data, it must have a way to determine how much data is to be skipped. In other words, a receiver may not only need to be able to recognize that it doesn't support a portion of the data, it may also need to know where the data to be skipped begins and ends. In one embodiment, this may be built into the indexing functionality, for example, an index may include information locating the beginning and end of each group. In some embodiments, although a group may have the same base protocol version, it may be desirable to include some optional components with a different (e.g., a higher) protocol version in the group. In this case, a way of marking these components as optional may also be desirable.

The means for navigating or otherwise referencing the structure of the signaling/versioning data such that the structure can be amended and/or extended may be useful in order to make future protocol version revisions and new protocol versions of the communication system. For example, if the structure is a tree structure, the means for navigating the tree must include the ability to navigate to new or amended nodes or leaves in the tree; otherwise, the means for navigating the tree cannot support an amended tree. In one implementation, this may be a set of commands for navigating the tree structure which supports navigating to any node or leaf of the tree. An example of such a command set is described in more detail with respect to FIGS. 15-17. Such a command set is referred to herein as an "extensible control language" or "XCL". Whatever structure is used for the signaling/versioning data, (e.g., tree, table, or any structure), the means for navigating or otherwise referencing it should allow for amendments and/or extensions to that structure.

Similarly, it may be useful to provide a means for extending the means for navigating or otherwise referencing the structure. In other words, the signaling method itself should be flexible and extensible. This may be as simple as reserving a fixed number of bits or values for future navigation or referencing information, however, an indefinitely extensible system may be preferable. As an example, consider again the tree based structure described above for the signaling/versioning data, and the command set for navigating the tree. Any given command in the command set might be enumerated as a value in a fixed length field. Instead of reserving a few values of the field for unknown future use, and being limited (within that signaling protocol version) to those few values for any new commands, a command may be defined for extending the field by another fixed increment. The extended field may be used for new commands until all values of the extended field are defined, and the field may again be extended by the 'extend field' command; this may continue indefinitely without breaking backward compatibility.

Embodiments and exemplary implementations of such an extensible signaling framework are described below with respect to a broadcast system, e.g., a digital television broadcast system. It should again be noted, however, that while the methods described herein may be used with broadcast systems, such as depicted in FIG. 1 and described below according to various embodiments they may also be used more generally, e.g., with any communication system where appropriate.

FIG. 1—Digital Television Broadcast System

FIG. 1 illustrates an exemplary broadcast system 100 according to one embodiment of the invention. In one embodiment, the broadcast system may be a digital television broadcast system. The broadcast system 100 described herein, including the various methods described herein, may be used for broadcasting any of various types of data, including audiovisual information as well as other data. The term "broadcast" as used herein is intended to encompass the full range of its ordinary meaning, as understood by one of skill in the art.

As used herein, the terms "audiovisual information" and "multimedia stream" include any of various types of information or data that comprises video data and/or audio data. The term "video data" includes motion video (such as television, movies, streaming video, etc.), as well as image data, such as JPEGs. The terms "audiovisual information" and "multimedia stream" further include any of various types of information or program instructions that, when executed, cause a device to present video data (on a display) and/or audio data (on speakers). For example, the terms "audiovisual information" and "multimedia stream" include any of various types of gaming content (including program instructions and/or data) that can be used and/or executed to present gaming content (e.g., images, video, and/or audio) on a presentation device.

In one set of embodiments, the broadcast system may operate according to the ATSC (Advanced Television Standards Committee) standard, e.g., using 8-VSB modulation. Alternatively, the broadcast system may operate according to a modified version of the ATSC standard, or according to another standard. For example, the Mobile/Handheld (M/H) modification of the ATSC standard is used for transmission of audiovisual information for moving receivers. Specific examples of the embodiments disclosed herein may be based on, or include portions of the M/H modification to the ATSC standard, and may also include further variations and modifications to M/H and the ATSC standard. However, the embodiments related to transmission of audiovisual information disclosed herein are not necessarily limited to use with the ATSC or M/H systems, and may be equally applicable for transmission of audiovisual information in accordance with other standards and/or modulations schemes, such as DVB-T/H, ISDB-T, DMB-T/H, etc.

As shown, the system 100 comprises a transmission system (or transmit system) 102, and one or more audiovisual devices (e.g., one or more stationary devices such as 112A, and/or one or more mobile devices such as 112B-112E). As noted above FIG. 1 is exemplary only, e.g., an exemplary system may comprise one or more transmission systems 102, a plurality of mobile devices, and a plurality of stationary devices. Any of the various methods described herein may be utilized with either mobile devices or stationary devices, or both, as desired.

The transmission system 102 may be configured to transmit audiovisual information to the one or more audiovisual devices 112 in a wired or a wireless manner. In a particular embodiment, the transmission system 102 may be configured to transmit digital television signals/channels wirelessly to the mobile devices 112B-112E. The mobile devices 112B-112E may receive and present the audiovisual information, e.g., receive and present the digital television signals/channels. The transmission system 102 may also be configured to transmit audiovisual information to the stationary device 112A (e.g., stationary television), either in a wired or a wireless manner. In some embodiments, an audiovisual device may be able to act as a transmission system; for example, an audiovisual device might be able to receive a transmission and re-broadcast it locally to other audiovisual devices. Thus, in some embodiments, the transmission system 102 may also be an audiovisual device.

The transmission system 102 comprises a transmitter 106 as well as transmit logic 104 coupled to the transmitter 106. The transmit logic 104 may comprise any of various types of logic, such as one or more computer systems (with accompanying software), digital logic, analog logic, programmable gate arrays, etc., or combinations thereof. The transmit logic 104 is adapted for receiving and/or storing audiovisual information (e.g., television data) and for generating packets containing the audiovisual information. The transmit logic 104 may generate packets according to any of various standards, such as the ATSC (Advanced Television Standards Committee) standard, e.g., using 8-VSB modulation. The transmission system 102 may use other modulation schemes, such as DVB-T/H, ISDB-T, DMB-T/H, etc. The transmit logic 104 may be configured to generate packets containing control information (e.g., signaling/versioning data) as described herein. In one embodiment, one or more of the digital television channels may be intended for stationary receivers, such as televisions. One or more of the digital television channels may also be intended for mobile and/or handheld (M/H) (referred to collectively herein as "mobile") devices 112B-E. In one embodiment, one or more of the digital television channels may be intended for either stationary receivers or mobile devices.

As described herein, for digital television channels intended for mobile devices 112 (and possibly for all channels, e.g., channels intended for stationary devices 114 and/or mobile devices 112), the configuration of the transmit/receive system (the transmission logic 102 and the receivers in each of the mobile devices 112) may be dynamically modified based on various factors, such as received instructions, current channel characteristics, usage patterns, etc. The transmit logic 104 may thus be configured to modify its configuration (by modifying parameters in one or more of its communication layers) and also provide control information to the various mobile devices to instruct them to modify their configurations in a similar manner.

The transmit logic 104 may thus be configured to generate packets containing audiovisual information as well as packets containing control information. The control information may be comprised in packets that use an otherwise unassigned PID. The control information may be useable to dynamically reconfigure operation of the mobile devices, e.g., dynamically configure communication layers operating in the mobile devices. The operation of the mobile devices 112 (and the transmission system 102) may be dynamically configured depending on current channel conditions of the wireless communication medium. The control information may provide for "cross layer control" of the communication layers in the mobile devices 112, as described herein.

The mobile devices 112 may be any of various types of devices, such as portable computer systems (laptops) 112B, wireless telephones 112C (e.g., Blackberrys, iphones, etc.), personal digital assistants 112D, television equipment 112E configured in vehicles, and other types of portable devices capable of displaying received audiovisual information.

The stationary device(s) 112A may be any of various types of devices that are intended to be placed at a fixed location (referred to as stationary or "non-mobile"), such as conventional televisions, e.g., liquid crystal displays (LCD displays), plasma displays, etc.

The audiovisual devices 112 are configured to receive the packets transmitted by the transmitter 106, including audiovisual information and control information. A respective audiovisual device 112 may also include receiver logic for processing the received audiovisual information, as well as a display for presenting video information and one or more speakers for presenting audio information. Thus each of the audiovisual devices 112 may include television-like capabilities for presenting received television channels as described herein.

In some embodiments, a method generates control information to dynamically configure the receiver (e.g., the receiver logic in mobile device(s) 112). The control information is designed to modify the receiver in a manner compatible with the modifications made to the transmission system 102. As described above, this may comprise generating commands to modify various corresponding operational characteristics of the receiver, such as video codec used, audio codec used, image resolution, the amount and/or type of forward error correction, receive parameters, the methods of signaling and announcement, the streaming and file delivery protocols, multiplexing arrangement, etc. The control information may be based on received instructions and/or the channel characteristics of the wireless communication medium.

In generating control information to configure the transmission system and the receiver, the method is configured to generate commands operable to adjust one or more of a plurality of the "communication layers" in each of the transmit logic 104 and the receiver, including the Physical layer as well as the higher layers, such as the Management layer and Presentation layer. In other words, the method may examine current parameters of a plurality of the communication layers and then generate the control information to modify or configure one or more of the communication layers based on the current parameters of the plurality of the communication layers. As another example, the control information may comprise at least one command for modifying a physical layer in each of the transmit/receive logic, such as modifying an amount of forward error correction applied to packets, modifying an encoding scheme used in the system, modifying a modulation scheme and/or altering the amount/placement of known training sequence data inserted to aide mobile reception.

Figure 2:
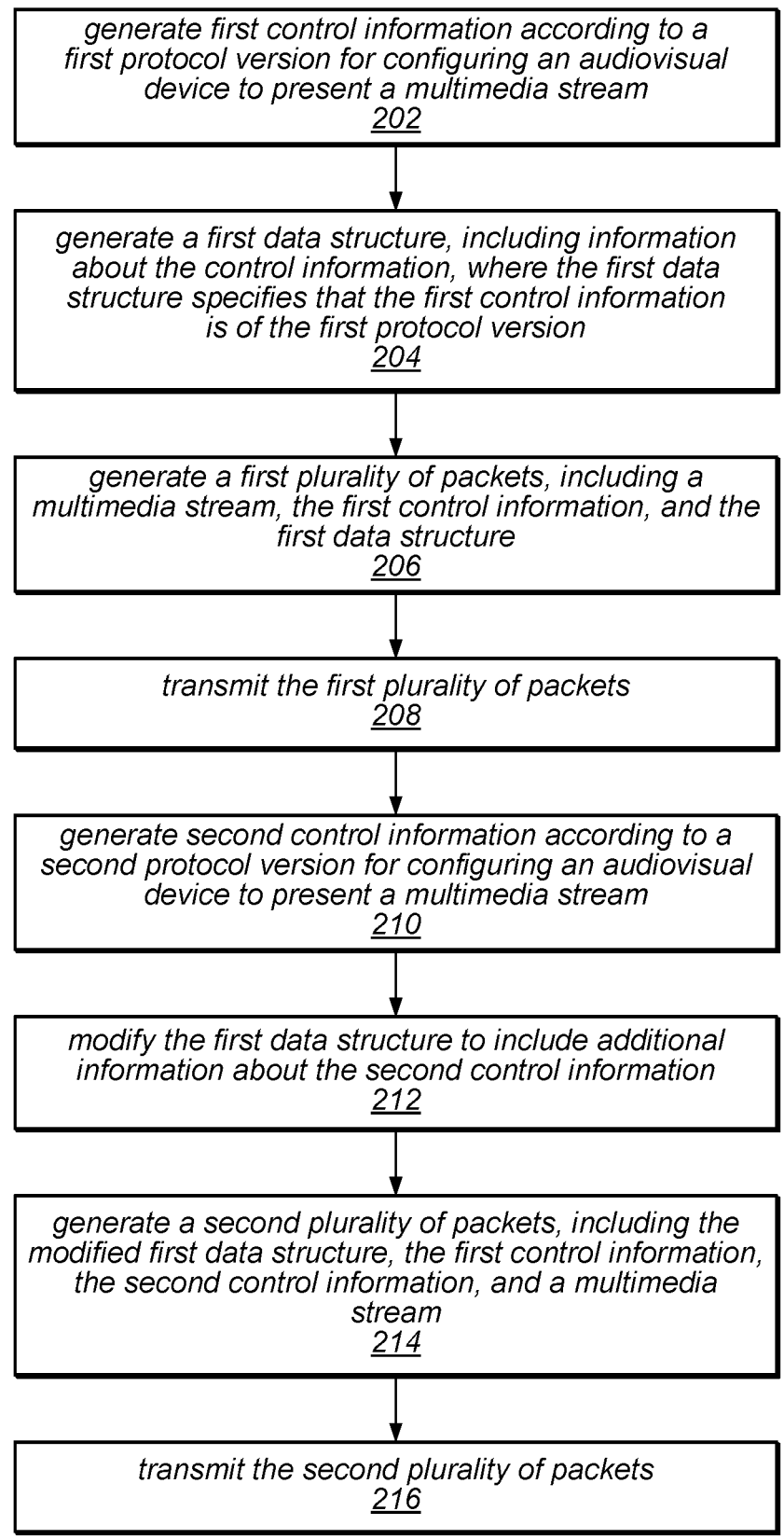
FIG. 2 is a flowchart diagram illustrating a method for generating control information for use in transmission with a multimedia stream to an audiovisual device according to one embodiment.

FIG. 2—Transmit Flowchart

FIG. 2 is a flowchart depicting a method for transmitting control information for use with a multimedia stream to an audiovisual device. The method may be performed by a transmission system such as described above and shown in FIG. 1, e.g., a system including transmit logic and a transmitter. The multimedia stream may be for reception by mobile devices; alternatively, the multimedia stream may be for reception by stationary devices, or, both mobile and stationary devices. It should be noted that, according to various embodiments, one or more of the steps may be omitted, repeated, or performed in a different order than shown in FIG. 2 and described below.

In 202, first control information according to a first protocol version may be generated. The first control information may be for configuring an audiovisual device to present a multimedia stream in a first manner (e.g., according to a first service type). The first control information may be a series of commands and data for an audiovisual device to navigate a tree-based data structure and setting parameter values for one or more leaf nodes of the tree. For example, the first control information may be a series of XCL commands (such as shown and described with respect to FIGS. 15-17) for navigating and defining an ATSC M/H tree, (such as shown and described with respect to FIG. 19, 20, or 22). Thus, the first control information might be coded as shown in FIG. 22, or 24, or similarly. Alternatively, the first control information may be any sort of control information for configuring an audiovisual device to present a multimedia stream. The first control information may be generated according to a first protocol version. For example, in one embodiment the first control information might be generated according to a version 1.0 XCL.

In 204, a first data structure may be generated, including information about the first control information. The first data structure may specify that the first control information is of the first protocol version. In other words, if the first control information is version 1.0 XCL, the first data structure may indicate this. The first data structure may also (or alternatively) indicate any of various other kinds of information about the first control information, such as location information (such as an offset) for the first control information, and/or a class or type of service of a multimedia stream specified by the first control information. For example, the first control information might be for configuring an audiovisual device to present a multimedia stream in 3-D, or in 2-D. The first data structure may also include information defining itself, e.g., specifying its size, protocol version, structure, etc.

In one embodiment, the first data structure could be a service descriptor, such as described below with respect to FIGS. 12-14. Thus, in this case the data structure would include information defining itself (e.g., protocol version, length, number of columns, length of columns) as well as information about the first control information (type(s) of information, and data for each type of information). Alternatively, the first data structure could be any kind of data structure.

In 206, a first plurality of packets may be generated. The first plurality of packets may include a multimedia stream (e.g., audiovisual information) specified by the first control information, the first control information, and the first data structure. The multimedia stream may be received and/or stored prior to generation of the packets including the multimedia stream. The first plurality of packets may include separate subsets of packets, where one subset includes the multimedia stream, while one subset includes the first control information and the first data structure. The subsets may be separate, or may be mixed together (e.g., multiplexed). Alternatively, the information may separated in a different way, or may be generated into similar packets containing the multimedia stream, the first control information, and the first data structure. The packets may be generated according to any of various formats, e.g., IPv4, IPv6, MPEG-2, or others.

In 208, the first plurality of packets may be transmitted. The first plurality of packets may be transmitted by a transmission system, such as described with respect to FIG. 1 according to various embodiments. In some embodiments, the first plurality of packets may be provided by a server, e.g., an internet server. The transmission system may thus be a one-way communication system (e.g., a broadcast system) or a two-way communication system (e.g., over the internet, a cellular network, or any two-way communication system).

In 210 second control information according to a second protocol version may be generated. The second control information may be for configuring an audiovisual device to present a multimedia stream in a second manner, e.g., according to a second service type. Much like the first control information, the second control information may be a series of commands and data for navigating a tree-based data structure and setting parameter values for one or more leaf nodes of the tree. For example, the second control information may be a series of XCL commands (such as shown and described with respect to FIGS. 15-17) for navigating and defining an ATSC M/H tree, (such as shown and described with respect to FIG. 19, 20, or 22). Thus, the second control information might be coded as shown in FIG. 22, or 24, or similarly. Alternatively, the second control information may be any sort of control information for configuring an audiovisual device to present a multimedia stream. The second control information may be generated according to a second protocol version, which may be different than the first protocol version. For example, if the first control information is generated according to a version 1.0 XCL, the second control information might be generated according to a version 2.0 XCL, or an entirely different command language or form of control information.

The second control information may be for configuring an audiovisual device to present the same multimedia stream for which the first control information specifies configuration information for an audiovisual device. Alternatively, the second control information may be for configuring an audiovisual device to present a different multimedia stream (e.g., a different type of multimedia stream, such as a multimedia stream according to a different protocol version than the first multimedia stream) than the first control information.

In 212, the first data structure may be modified to include additional information about the second control information. For example, if the first data structure is a service descriptor (as described according to various embodiments with respect to FIGS. 12-14), the column length field might be modified to indicate an additional item in each column. The information about the second control information might then be included as the second item in each column. Thus, the modified first data structure might include similar information for the second control information as for the first control information, e.g., protocol version of the second control information, type or class of service, major/minor channel number, location information (such as an offset), etc. It should be noted that the first data structure may retain the information about the first control information in addition to being modified to include the additional information about the second control information. In one embodiment, the format of the data structure may be modified. For example, the first data structure could be a version 1.0 service descriptor, while the modified first data structure could be a version 2.0 service descriptor. The modified first data structure may include information specifying its format, e.g., may include version information for the modified first data structure, and/or size information for the modified first data structure. Alternatively, the data structure might be a different kind of data structure than a service descriptor, and may be modified to include the additional information about the second control information in any number of ways.

In another embodiment, the first data structure may not be modified, but rather a second data structure may be generated. The second data structure may be similar to the first data structure, but with information about the second control information rather than information about the first control information; alternatively, the second data structure may be a different kind of data structure. For example, the second data structure may be a service descriptor of a different protocol version, or another kind of data structure altogether. Such a second data structure might still include similar information as the first data structure but for the second control information, e.g., protocol version information for the second control information, location information (such as an offset), etc.; alternatively, the second data structure might include any of various different kinds of information about the second control information.

In one embodiment, the information in the data structure (s) about the first and second control information may be usable by a receiver (e.g., a receiving audiovisual device) to determine what control information it can or should use and what control information it can or should ignore. For example, the first data structure might identify the first control information as being of a first protocol version, and provide a location of the first control information in the plurality of packets; thus, if an audiovisual device is not configured to parse the first protocol version of the first control information, the audiovisual device may be able to use the information in the first data structure to ignore the first control information. Similarly, if there are a number of sets or groups of control information, a data structure such as a service descriptor may be used by an audiovisual device to determine more than one group of control information whose protocol versions it is not configured to understand, and the audiovisual device may thus be able to use that data structure to ignore those groups of control information whose protocol versions it is not configured to understand.

In 214, a second plurality of packets may be generated, including the modified first data structure, the first control information, the second control information, a multimedia stream specified by the first control information, and a multimedia stream specified by the second control information. Each multimedia stream may be received and/or stored prior to generation of the packets including the multimedia stream. The multimedia stream specified by the second control information may be the same multimedia stream as the multimedia stream specified by the first control information; alternatively, they may be two different streams. For example, the multimedia stream specified by the first control information may be generated according to a first protocol version, while the multimedia stream specified by the second control information may be generated according to a second protocol version.

The second plurality of packets might also include other information, such as additional multimedia streams, additional control information (e.g., for the additional multimedia streams), and/or additional data structures (e.g., providing information such as location and protocol version information about the additional control information). It should also be noted that the first data structure (or the second data structure) might also include additional information about additional control information, for example, a single data structure could include information about a plurality of sets or groups of control information, where each set or group of control information could be of a different protocol version, and/or have one or more other defining characteristics that could be used to index that group of control information. In one embodiment, the second plurality of packets may include information specifying a number of data structures which are included in the second plurality of packets, for example, if there are two or more data structures.

The second plurality of packets may include separate subsets of packets, where there is one subset for each multimedia stream, while one subset includes the first control information and the first data structure. The subsets may be separate, or may be mixed together (e.g., multiplexed). Alternatively, the information may separated in a different way, or all the packets generated may similarly contain portions of each of the multimedia stream, the first control information, and the first data structure. The packets may be generated according to any of various formats, e.g., IPv4, IPv6, MPEG-2, or others.

In 216, the second plurality of packets may be transmitted. The second plurality of packets may be transmitted by a transmission system, such as described with respect to FIG. 1 according to various embodiments. In some embodiments, the "transmitting" the first plurality of packets may include providing of the first plurality of packets by a server, e.g., an internet server. The transmission system may thus be a one-way communication system (e.g., a broadcast system) or a two-way communication system (e.g., over the internet, a cellular network, or any two-way communication sy stem)).

In some embodiments, additional pluralities of packets (e.g., a third, a fourth, etc) may be generated and transmitted, including additional control information, additional or modified data structures, additional multimedia streams, etc., as new protocol versions, services, etc., are developed and/or released.

The method described above for transmitting control information for use with a multimedia stream to an audiovisual device may be performed by a system for transmitting control information for a multimedia stream to an audiovisual device according to various embodiments. For example, the system might include an input for receiving one or more multimedia streams, transmit logic for generating and/or modifying control information, data structures, and/or packets, and/or a transmitter for transmitting packets.

Figure 3:
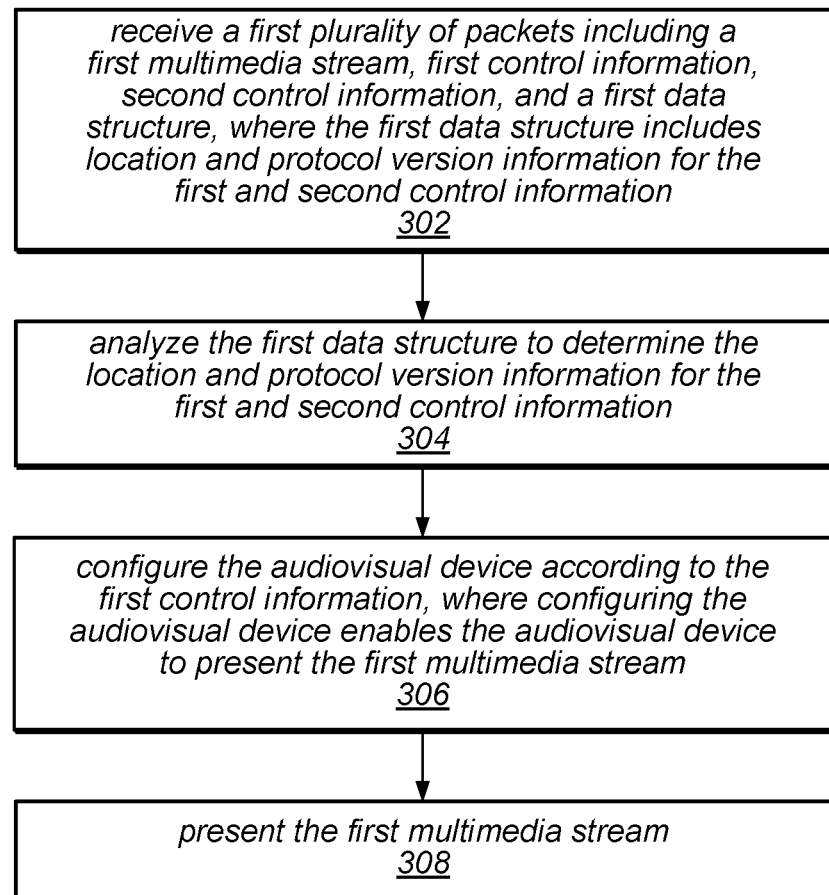
FIG. 3 is a flowchart diagram illustrating a method for an audiovisual device to receive control information for a multimedia stream according to one embodiment.

FIG. 3—Receive Flowchart

FIG. 3 is a flowchart depicting a method for an audiovisual device receiving control information for a multimedia stream. The method may be performed by any kind of audiovisual device. For example, the method may be performed by a mobile device such as described above and shown in FIG. 1, e.g., portable computer systems (laptops), wireless telephones (e.g., Blackberrys, iphones, etc.), personal digital assistants, television equipment configured in vehicles, and other types of portable devices capable of displaying received audiovisual information. Alternatively, in some embodiments, the method may be performed by a stationary device, such as also shown in FIG. 1 and described above, e.g., a conventional television, such as liquid crystal display (LCD display) television, a plasma display television, etc. It should be noted that, according to various embodiments, one or more of the steps may be omitted, repeated, or performed in a different order than shown in FIG. 3 and described below.

In 302, a first plurality of packets may be received. The first plurality of packets may include a first multimedia stream, first control information, second control information, and a first data structure. The first data structure may include location and protocol version information for the first and second control information. The first and second control information may have been generated according to different protocol versions. Each set of control information may be for the first multimedia stream, or may be for different multimedia streams. For example, the first plurality of packets may include one or more additional multimedia streams. In various embodiments, the data structure may be a service descriptor. The first and/or the second control information may have been generated according to embodiments of XCL, e.g., different protocol versions of XCL. If there are multiple multimedia streams, some may be of different protocol versions than others.

In 304, the first data structure may be analyzed to determine the location and protocol version information for the first and second control information. The audiovisual device may be able to use the first data structure (e.g., the location and protocol version information) to determine which control information it can or should use to configure itself, and conversely, which control information it may be able to ignore. Thus, the audiovisual device may not be configured to understand the second protocol version of the second control information, and may therefore use the location information of the control information to ignore the second control information.

In 306, the audiovisual device may be configured according to the first control information. The audiovisual device may be configured to understand the first protocol version. Thus, the audiovisual device may be able to use the information in the data structure to determine the location of the first control information and parse the first control information. Thus, the audiovisual device may use be able to configure itself according to the first control information. Configuring the audiovisual device may enable the audiovisual device to present the first multimedia stream.

Figure 4:
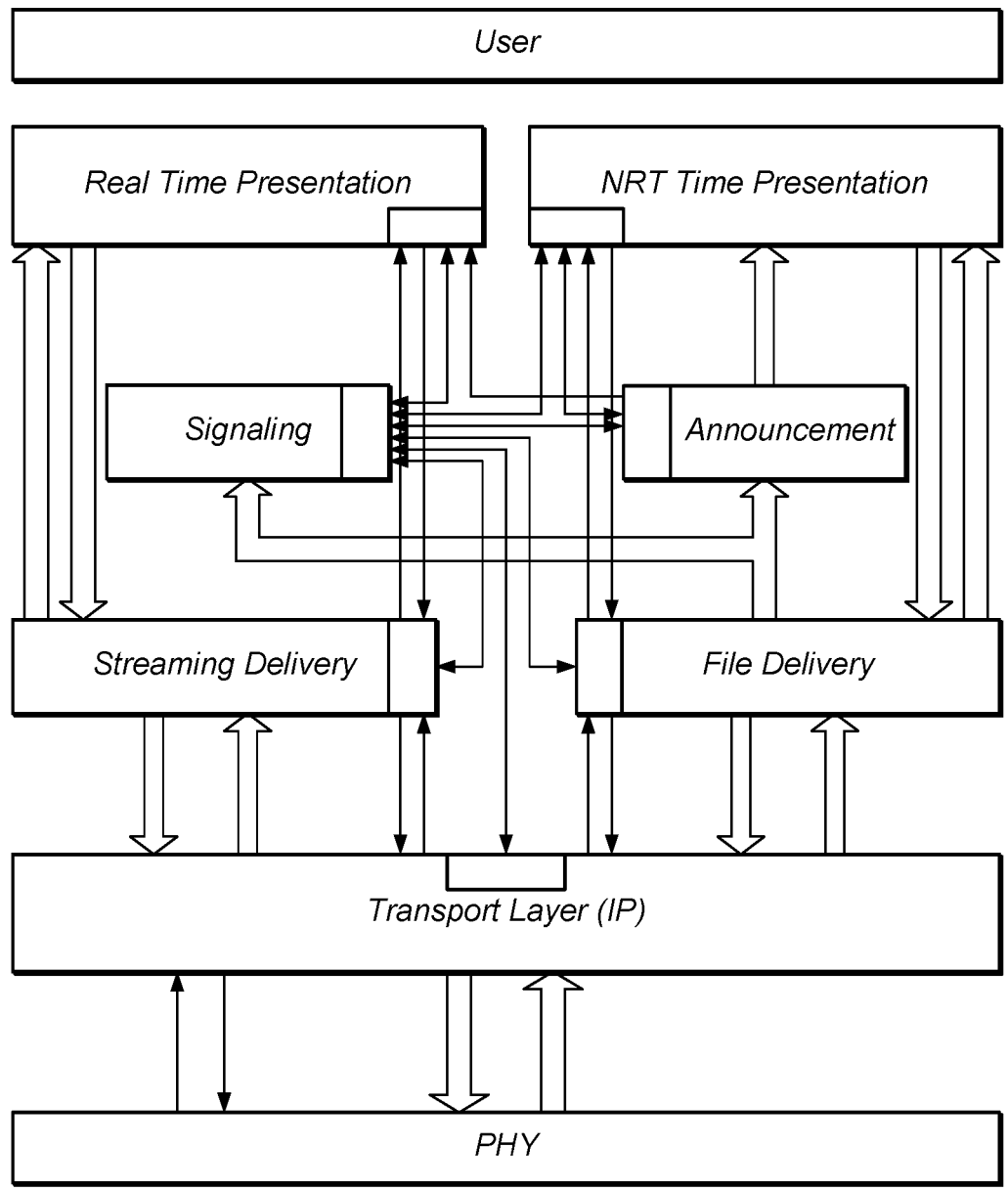
FIG. 4 is an illustration of an architecture with in-line signaling according to one embodiment.

In 308, the first multimedia stream may be presented. Presenting the first multimedia stream may include presenting video information on a display and/or presenting audio information on one or more speakers FIG. 4—Architecture with in-Line Signaling FIG. 4 illustrates a system architecture with in-line signaling, as commonly used in the art. It is customary in communication systems to have the signaling information processed by many of the system blocks that are involved in the processing of the service, thus those blocks are restricted in their ability to be changed without breaking backwards compatibility. For example, FLUTE is a file management protocol. It is used to manage file based content, including the signaling in many wireless standards like OMA BCAST and DVB-H. The signaling information is passed from the transmitter to the target receiver in FLUTE file format. This means that the FLUTE functionality cannot be changed in a non backwards compatible way, and it cannot be replaced. If the target receiver has a version 1.0 FLUTE functionality, and the transmitter sends the signaling information in a FLUTE 2.0 version format (assumed not to be backwards compatible), the receiver will drop the packet at the FLUTE functionality and the signaling functionality will never see any indication the information was ever received. For this reason, it may make more sense to include signal processing at a lower level, e.g., as in the system architectures shown in and described with respect to FIGS. 8 and 9.

Figure 5:
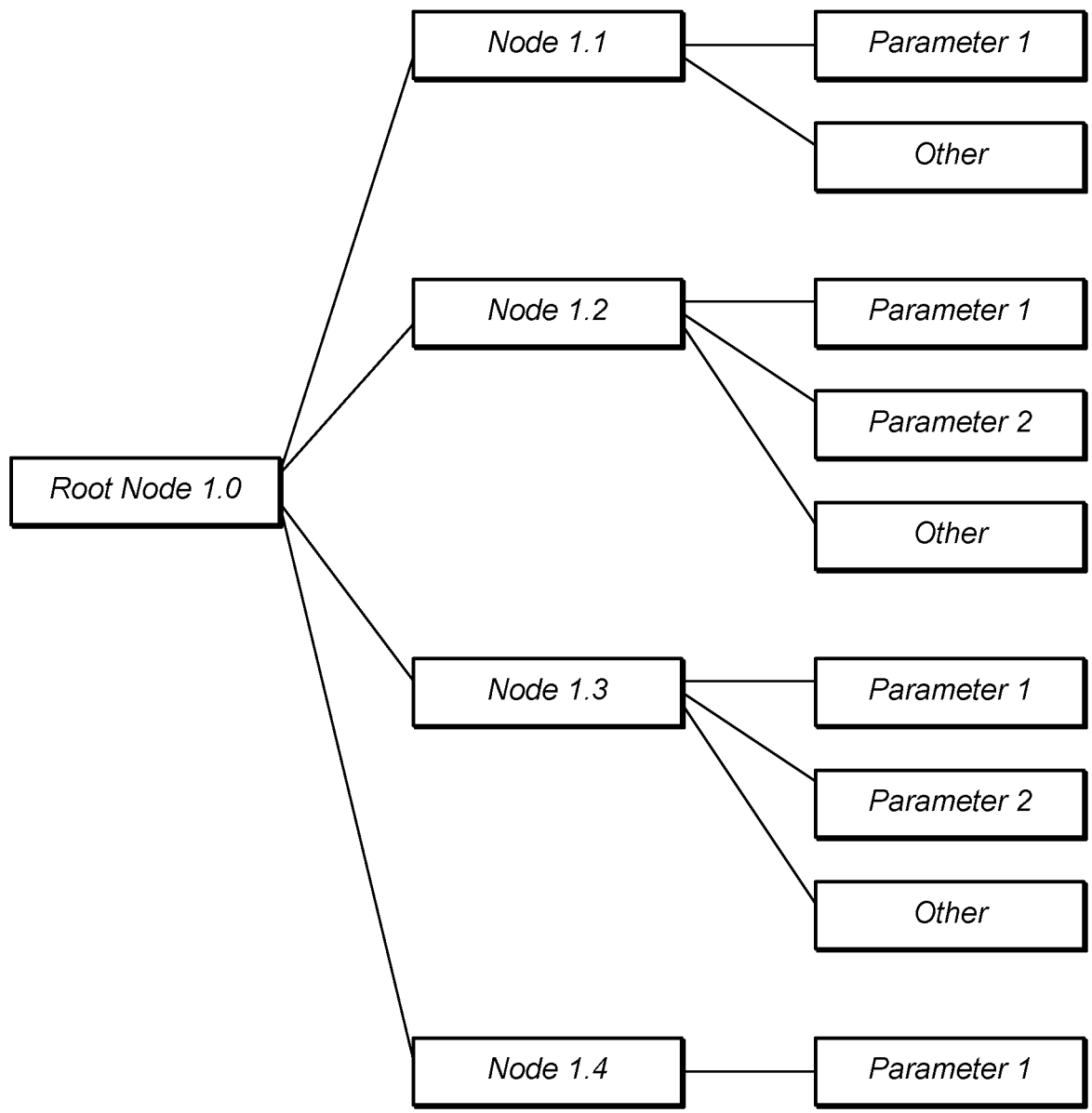
FIG. 5 is an illustration of a tree based data structure according to one embodiment.

FIG. 5—Tree Based Data Structure

As mentioned above, one aspect of an extensible signaling/versioning framework is a structure for the signaling/versioning information which allows for insertion of new or modified signaling/versioning data in such a way that a receiver (e.g., an audiovisual device) which doesn't support the new/modified signaling/versioning data can skip or ignore it.

Current signaling schemes typically rely on static tables to communicate system parameters and other system configuration information. Such a table might have a bit defined structure for communicating parameters including a mixture of raw binary values and enumerated types. A few bits may be reserved for future use, but there is typically no way to extend or change such a table without breaking backward compatibility. An exemplary form for such a table might be as follows:

| Syntax | # of bits |
|---|---|
| List Header ( ){ | |
| Parameter 1 | 3 |
| Parameter 2 | 1 |
| Parameter 3 | 16 |
| . | |
| . | |
| . | |
| Parameter N | 4 |
| } | |

Such tables have been used in the ATSC M/H system for transmitting a Transmission Parameter Channel (TPC), a Fast Information Channel (FIC), and a Service Map Table (SMT). The TPC provides the configuration of and relative location in the M/H communication protocol. The FIC provides binding information between an M/H service (e.g., virtual channel) and an M/H ensemble (M/H data structure). The SMT provides binding information between an M/H service (e.g., virtual channel) and the IP datagrams.

These tables may be a relatively bit efficient format for signaling information, but leave little room for modifying or extending the format. As shown, this scheme does not support protocol versioning; the versioning bits included in the tables are used to signal if there has been a change to the data signaled, not a change to the signaling or other functionality related to the protocol itself.

One option to provide the desired extensibility is simply to include versioning information for the tables (or portions of the tables) within the tables.

Another alternative to the use of static data tables is the use of tree based data structures. FIG. 5 illustrates an exemplary tree based data structure. A data tree may include a root node, one or more 'sub-nodes' (or 'branches'), and one or more leaves for each of the branches. A tree may also have additional layers, e.g., 'sub-sub nodes' (or 'twigs'), as desired.

A tree based data structure allows for each node and/or leaf to be individually defined in terms of both its versioning information and its actual value or values (e.g., parameter values). A tree based data structure also allows nodes to be added without breaking backwards compatibility. Thus, tree based data structures may provide significantly more extensibility and forward compatibility than static data tables. Communication using tree based data structures can potentially incur significant additional overhead, e.g., may be less bit efficient than a static table, depending on the command set used with the tree. However, with a bit efficient command set, such as described below with respect to FIGS. 15-17, this problem may be substantially mitigated, e.g., given a bit efficient command set, communicating using a tree based data structure may be comparable in bit efficiency to using a data table.

Figure 6:
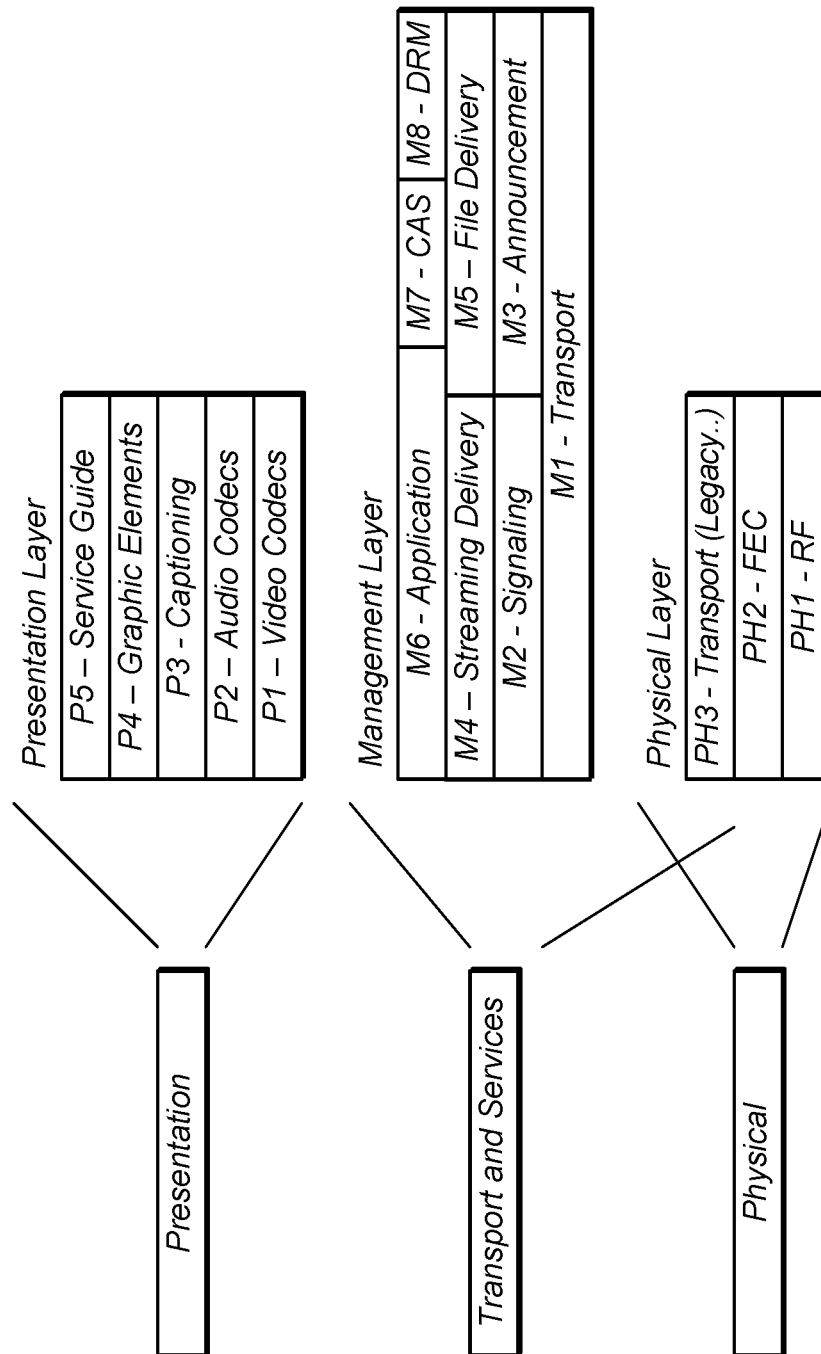
FIG. 6 is an illustration of the base version functional blocks of the ATSC M/H system according to one embodiment.
Figure 7:
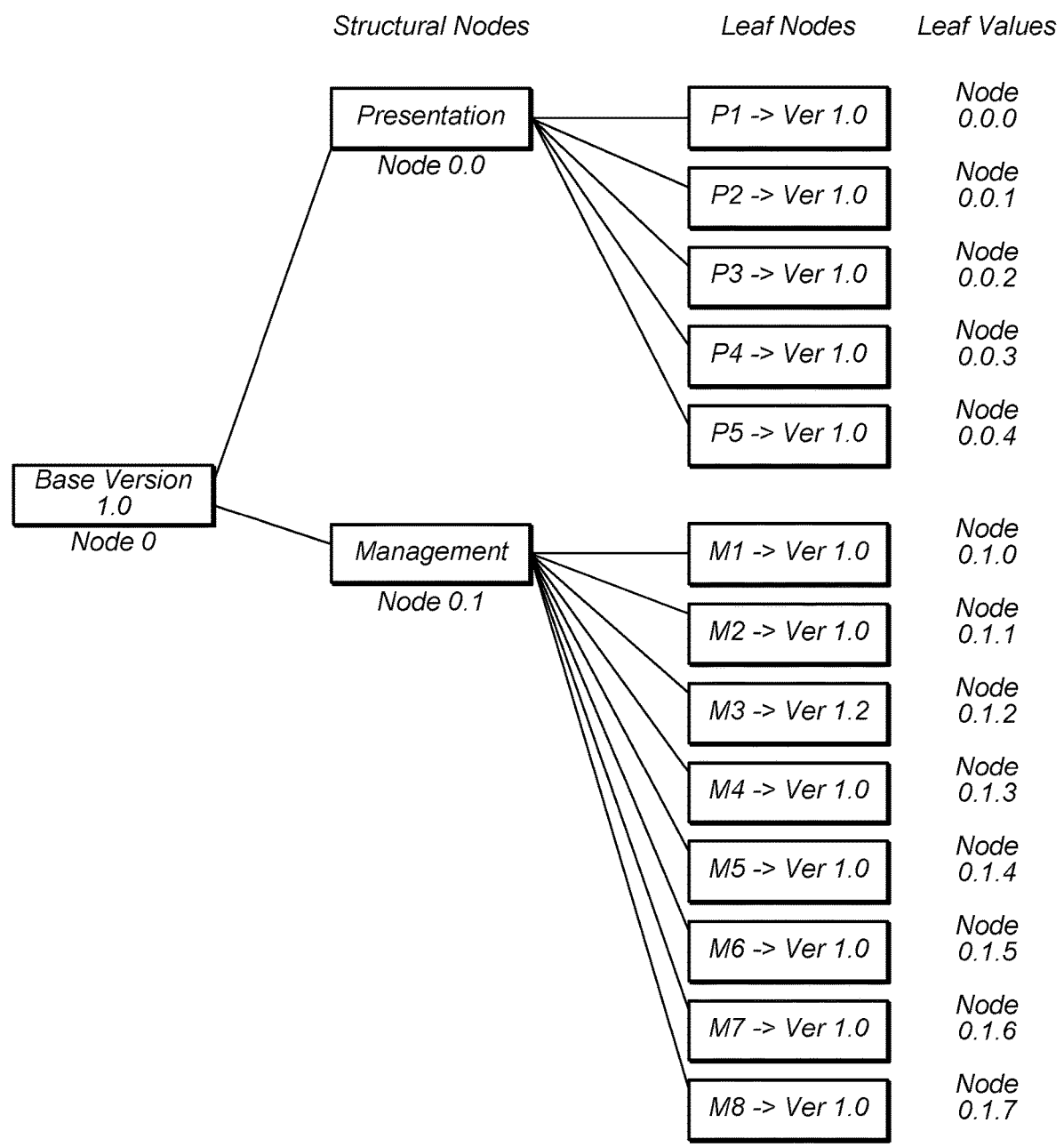
FIG. 7 is an illustration of a tree based data structure encompassing versioning for ATSC M/H functional blocks according to one embodiment.

FIGS. 6 and 7—ATSC M/H Functional Blocks

FIG. 6 illustrates an exemplary partitioning of the ATSC M/H system into a set of functional blocks for versioning. The term versioning is used here to specify a methodology for assigning revision numbers to updates in functionality and for communicating the revision numbers in a way that supports robust communication with legacy and current version receivers simultaneously. The methodology can then be used to extend services from a given transmitter to legacy and current generation receivers simultaneously.

As shown in FIG. 6, the functional blocks may be divided into multiple layers of a protocol stack. Thus, there may be a presentation layer, a management layer, and a physical layer in one embodiment. Each protocol layer may include a number of elements; e.g., as shown, the presentation layer may include a service guide, graphic elements, captioning, audio codecs, and video codecs. Various other protocol stacks, including different protocol layers and/or different elements within the protocol layers, are also envisioned. For example, it should be noted that some embodiments of the invention provide for modifying or replacing a receiver's protocol stack. Thus, in one embodiment, a new protocol version could specify addition, replacement, retirement, or rearrangement of one or more elements of a protocol stack. In one embodiment, a tree based structure, such as shown in FIG. 7, may be used to navigate and configure a device according to the revised protocol stack (e.g., if the new protocol version is supported) or according to the previous protocol stack (e.g., if the new protocol version is not supported).

Figure 8:
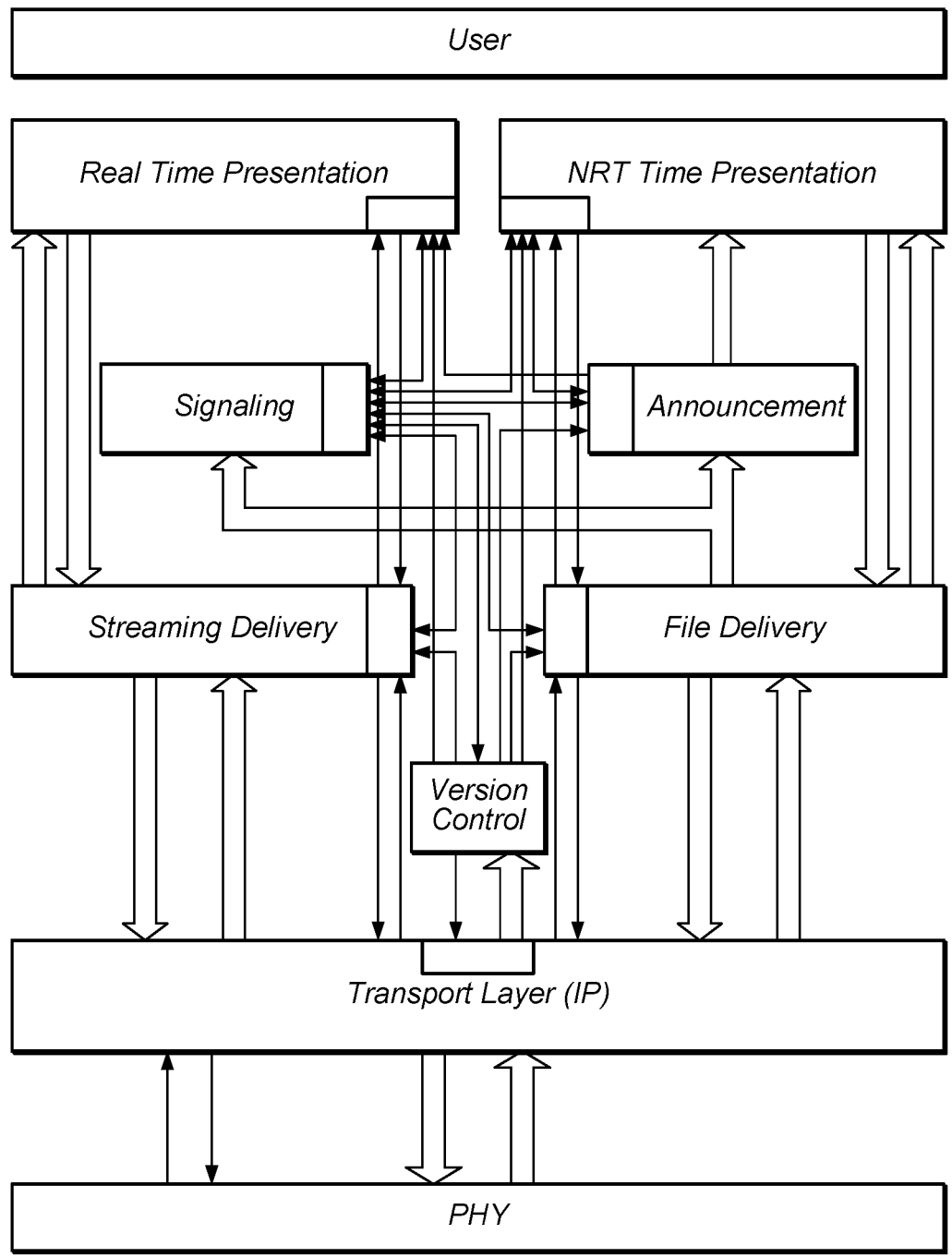
FIG. 8 is an illustration of an architecture with a separate versioning block according to one embodiment.
Figure 9:
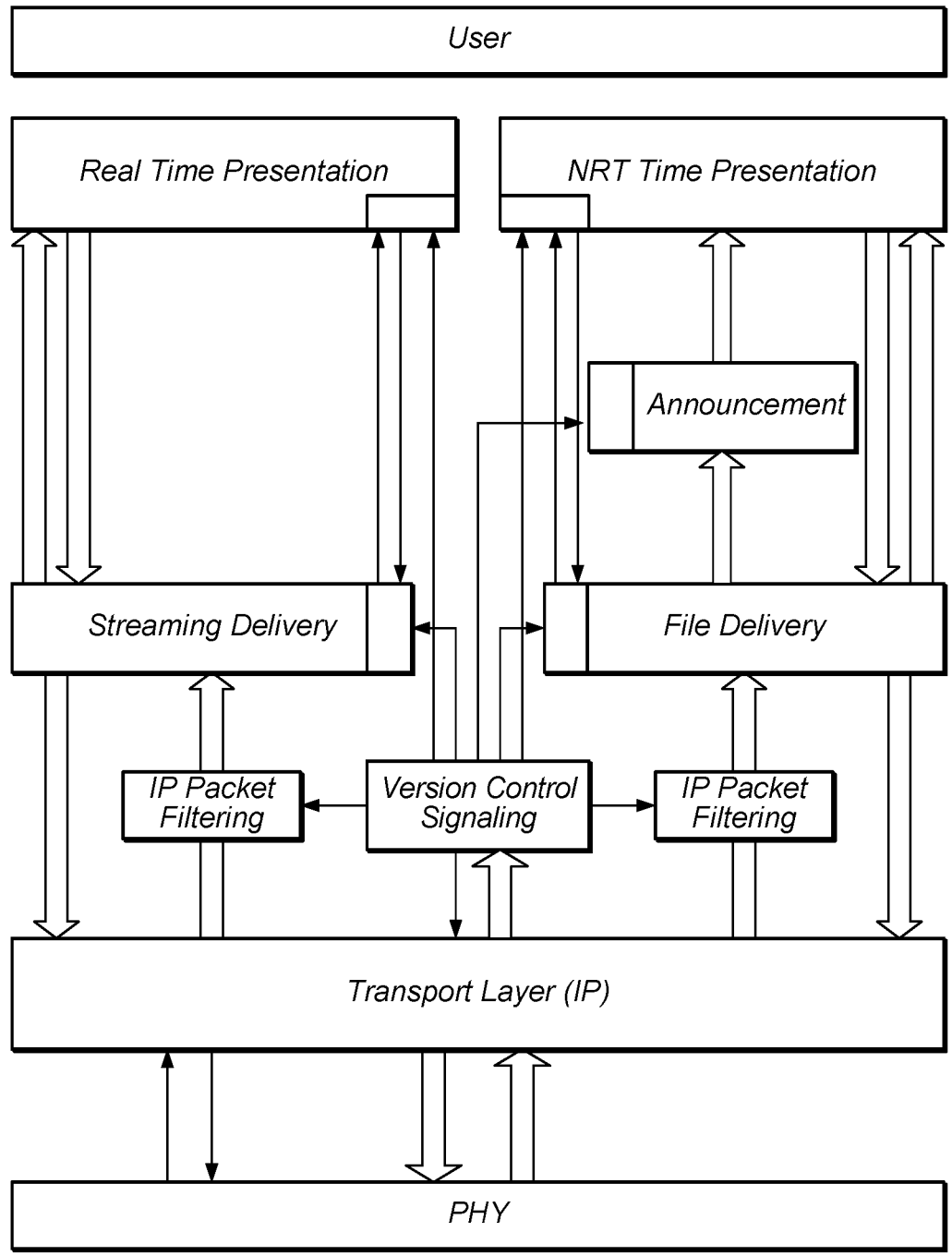
FIG. 9 is an illustration of an architecture with a combined versioning and signaling block according to one embodiment.

FIG. 7 illustrates a treed version of part of the ATSC M/H protocol stack described in FIG. 6. Each protocol element may be enumerated as a leaf of a respective node (e.g., protocol layer) of the tree (e.g., protocol stack). Thus, each node and element can be versioned separately FIGS. 8 and 9—Exemplary Architectures FIGS. 8 and 9 illustrate exemplary receiver system architectures in which the signaling and/or versioning processing functionality is lower in the system and/or separated from the processing of the services. This may mitigate the problems discussed with respect to FIG. 4. FIGS. 8 and 9 are exemplary only, thus it should be noted that other receiver architectures are also possible.

Figure 10:
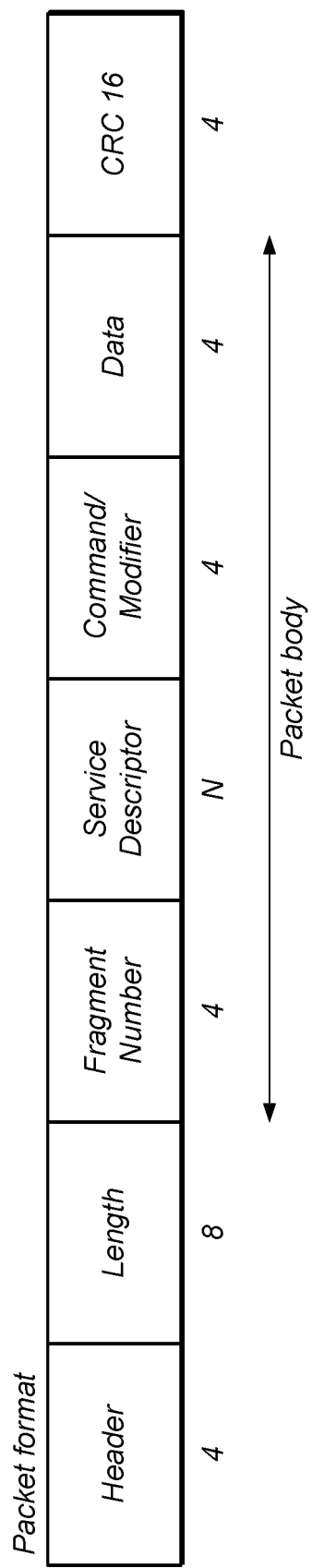
FIG. 10 is an illustration depicting a packet format according to one embodiment.

FIG. 10—Packet Format

FIG. 10 illustrates a packet format that may be used to communicate signaling/versioning data (or simply 'control information') for a multimedia stream according to one embodiment. As shown, packets may include fields for a header, a length, a fragment number, a service descriptor, commands/modifiers, data, and a CRC 16. Locations for the header, length, fragment number, service descriptor, and CRC 16 may be fixed. The content of the service descriptor may be configurable. The control stream itself may include a concatenated series of command/modifier/data nibbles. Although FIG. 10 shows one exemplary packet format, any number of other packet formats are also possible, including packets with different sized fields, additional fields, fewer fields, similar but modified fields, and/or any number of other differences. Definitions and further description of the fields of this exemplary packet format are provided below with respect to FIG. 11.

FIG. 11—Table of Control Packet Fields

FIG. 11 is a table defining the fields of a control packet according to one embodiment. As described above with respect to FIG. 10, in one embodiment the fields may include a header, a length, a fragment number, a service descriptor, commands/modifiers, data, and a CRC 16.

The header may be 4 bits (1 nibble) in length. The header may include the version number of the control packet. In other words, this provides a means to signal versioning information for the signaling method itself. Thus, while the fields described below might define the fields in a version 1.0 control packet, a future version might define the fields differently, or might include different fields; by signaling the version of the signaling method, a receiver may be able to cope with future updates to the signaling method (e.g., by updating its software to accommodate the new version, or ignoring the new version if it is incompatible).

The length field may be 8 bits (2 nibbles) in length. The length field gives the length of the packet body (as defined as the fields starting after the packet length field and ending with the last byte of the packet) in bytes. A receiver which recognizes by the packet header that it cannot support the packet, may at least be able to parse this field to determine how big the packet is, and thus, how far it should skip to begin attempting to parse the next packet in the control stream.

The fragment number field may be 4 bits (1 nibble) in length. The fragment number field gives the number of fragments in the packet, starting at the value 0001 (e.g., instead of starting at the value 0000). The value 0000 may be a special value indicating no fragmentation is used.

The service descriptor may be a variable number of bits. The service descriptor field maps the versioned signaling stream to services, as referenced by service identifier (IP address), major channel number, etc. The service descriptor, or service discovery table, may be used to index the control information, e.g., such that a receiver may determine which portion(s) in the control information it can and cannot support, and/or which portion of the control information may be relevant to a particular service to which the receiver is attempting to present. Further details on embodiments of the service descriptor are given below with respect to FIGS. 12-14.

The command, modifier, and data fields make up the control information of a control packet. In other words, the commands, modifiers, and data in these fields may be a means for navigating the structure (e.g., a tree structure) of the signaling/versioning information for configuring an audiovisual device to present an accompanying multimedia stream. According to one embodiment, each command, modifier, or data field may be 4 bits (1 nibble), or may be extended indefinitely in nibble increments. Thus, the means may be extensible. Further details on embodiments of a command set, referred to herein as an "extensible control language" ("XCL") are given below with respect to FIGS. 15-17.

The CRC 16 is a 16 bit cyclic redundancy check, calculated over the entire length of the packet, which may be used for error detection/correction purposes.

FIG. 12—Service Descriptor Format

FIG. 12 illustrates a format of the service descriptor field in an XCL packet according to one embodiment. The service descriptor may be formatted as a table with configurable column types. The service descriptor field may include a subfield for each of: service descriptor type, service descriptor length, number of columns, and column length. The service descriptor field may also include column type and data subfields for each column in the table.

FIG. 13—Table of Service Descriptor Fields

FIG. 13 is a table defining the subfields that make up the service descriptor field of an XCL packet according to one embodiment. As mentioned above with respect to FIG. 12, there may be subfields for service descriptor type, service descriptor length, number of columns, column length, column type, and data. Each subfield field may be 4 bits (1 nibble) in length, or may be extended indefinitely in nibble increments.

The service descriptor type may be used to version the service descriptor. In other words, the service descriptor may be versioned separately from (or in addition to) the versioning of the control packet as a whole. Thus, while the fields described below might define the subfields for one version of a service descriptor, a future version might define the fields below differently, or might include different fields; by signaling the version as the header, a receiver may be able to determine whether it is able to parse the service descriptor before actually attempting to parse the body of the service descriptor. Thus, if the receiver is not configured to parse a particular service descriptor, it may update its software to accommodate the new version, or ignore the new version if it is incapable of accommodating the new version.

The service descriptor length subfield specifies the length of the service descriptor field in nibbles. A receiver which recognizes by the service descriptor type that it cannot support the service descriptor, may at least be able to parse this field to determine how big the service descriptor is, and thus, how far it should skip to begin attempting to parse the next piece of information (such as another service descriptor which it can parse) in the control stream.

The number of columns (or "NumColumns") subfield specifies the number of columns in the table, which also effectively specifies the number of column type and data subfields to follow. The column length subfield specifies the number of items in each column. All columns may be the same length. By including fields specifying the number of columns and the length of the columns, the service descriptor is essentially able to define itself. Thus, the service descriptor may be a very flexible data structure by design, potentially allowing for a significant amount of modification and/or variation in the format and thus the information provided without requiring a new protocol version.

The column type subfield specifies the type of information in the following data field. A variety of possible types of information may be enumerated for a given service descriptor version; example types might be Version Number, Stream ID, IP Address, Major Channel Number, or Minor Channel Number.

A data subfield specifies values for each item of a column. The number of items, as mentioned above, is specified by the column length subfield. The length of each item may be specified (e.g., defined) as part of the column type. For example, if the column type is IPv4, then an item may be 32 bits.

FIG. 14—Exemplary Service Descriptor Field

FIG. 14 is a table showing an exemplary service descriptor field, broken down by subfield. In this example, the value of the service descriptor type may be '0000', indicating a base version. The service descriptor length may be '1011', indicating that there are 11 (1011 in binary) nibbles in the service descriptor. The number of columns may be '0011', indicating that there are 3 (0011 in binary) columns. The column length may be '0001', indicating that each column contains 1 item. Three column type subfields, each followed by a 1-item data subfield may follow. In this example, the column types are version number (enumerated as '0000'), major channel number (enumerated as '0001'), and an offset vector (0010). In other words, this service descriptor specifies that the control information for major channel '0001', which is of base version '0000', is located at the offset vector 0010.

A single service descriptor may be used to index multiple portions of the control information. For example, a service descriptor might point to a first group of commands, which might be for a particular service and/or of a particular protocol version, and also might point to a second group of commands, which might be for a different service and/or a different protocol version. Thus, if there are several groups of commands, but only one group has a base version of 1.0, and all other groups have higher base versions, a legacy receiver which can only support base version 1.0 may parse the service descriptor, and thereby determine that it can support the group with base version 1.0 but cannot support (and can therefore ignore or skip) the groups with higher base versions.

Multiple service descriptors may also or alternatively be used in some embodiments. For example, a service descriptor of a new protocol version may be used alongside a service descriptor of an older protocol version, to enable a legacy device to determine the services it can receive, and to also enable a current device to use the service descriptor with the new protocol version to determine the services it can receive. In some embodiments, a current device may be able to use more than one (e.g., in this example, both the newer and the older) service descriptor to determine services it can receive.

FIG. 15—Command Series Format

FIG. 15 is a table illustrating one possible format for a series of commands/data. As shown, there may be fields for a command to be performed, a length of the command payload in bytes (e.g., to allow an unknown command to be skipped by a legacy receiver), one or more navigational fields specifying a leaf or node where the parameter(s) to be specified are located, and the actual parameter(s) to be set.

FIG. 16—XCL Command Set

As noted above, following the service descriptor field in a control packet, there may be a concatenated series of command/modifier/data nibbles. FIG. 16 is a table defining one possible set of commands for communicating and navigating a tree based data structure. As noted above, this embodiment of a command language is referred to herein as "XCL".

An XCL language is a flexible, extensible method of structuring data, and more specifically a method of encoding tree based information in a very bit efficient way. The method may include of a set of commands, to be followed by a variable number of fields of data, used to communicate nodes in a tree and the corresponding parameter values located at each. The method is analogous to sectioning a table of data into groups of parameters, and encapsulating each group in a header that specifies the location of the parameter set in the table. Indeed, that would be another possible embodiment. Representation of parameters in this structured format supports the addition or subtraction of parameter sets in a forward compatible way. Legacy receivers that encounter unrecognized nodes, are able to skip over then and continue to parse data they support.

The language may also include a set of modifiers, which are parameters that can be applied across sections of the tree, enabling a short hand way of communicating that numerous nodes have values of a similar nature, thus avoiding the need to express the path to each node and the value of each modifying parameter separately. This capability is comparable to a header that encapsulates multiple groups of parameters with headers. Example uses of this capability would include a modifier used to specify that all the parameters on a section of the tree are ATSC M/H version 1.0 compatible, or that the parameters on one section of the tree are the same as those on another section of the tree with minimal differences. When the modifiers are used to specify the latter use, only the location of the comparable node and the differences may be specified.

In one embodiment, the command and data fields may be organized on nibble, byte, or any other fixed boundaries. Taking nibble boundaries as an exemplary embodiment, one bit in each nibble may be used to mark the nibble as either a command or data. For example, in one embodiment, the most significant bit (MSB) may be used. Thus, in this embodiment, if the MSB is a '0', that marks a command, while a '1' as MSB marks data. This, or any similar convention for marking commands and data nibbles as such, may be useful in enabling a receiver to parse the command and data information, e.g., a receiver may be able to determine that a series of nibbles each beginning with '0' are commands, and one or more nibbles following those commands which each begin with '1' are the data specified by those commands. Thus, a receiver may parse a series of commands (e.g., navigating to a node or leaf in the tree), followed by data (e.g., parameters for that node or leaf), and may recognize where the data ends and the next series of commands begins as the next nibble with a '0' as MSB. In some embodiments, this may save the overhead of using a dedicated length field to indicate to a receiver how long each command sequence is. In some embodiments, length fields may still be used with some or all of the commands. The three least significant bits (LSBs) of a command or a data field may indicate what the enumerated command or data value for a field is.

If necessary, a command or data field may be extended by setting the three LSBs to '111', or in other embodiments, to any other value specified to denote field extension. In this way, the command set may be extended indefinitely without interfering with a legacy receiver's ability to parse the command stream. That is, even if a receiver doesn't recognize the command in the extended field, it may still be able to recognize that the field was extended, and skip to the next field.

FIG. 16 includes brief descriptions of each command according to one embodiment. A more detailed description of each of these possible commands is given below.

The Node (or Group) pointer points to a parameter (or group of parameters) in a hierarchical tree structure. The node command combines navigation with parameter specification. The node command includes a variable number of data fields, some to specify the nodes traversed, one to specify a leaf location and a final one to specify the parameter/function set. When using the node command, the current node location is set to the node just above the leaf referenced for setting the parameter. For example, if a receiver is at the default node 0, and we desire to set the leaf at location 0.1.0.0 to value_1, the command would be 0001 (command), 1001(data), 1000(data), 1000(data), value_1 (data). The last data field is the parameter value. The next to last data field is the leaf location, and the current node is just above 0.1.0.

The Descend command specifies a relative path (downward) to a parameter location below the current one in the hierarchical tree structure. This command is used to navigate to a new node in the tree. The Descend command includes a variable number of data fields, each one specifying a node to traverse. The total number of nodes to traverse may be determined by how many data fields are following the Descend command, prior to the next command nibble. For example, if a receiver is currently pointing to the default node 0, and it is desired to point to node 0.1.1, the descend command would be 0100 (command), 1001 (data), 1001 (data). The command and data values are shown with their MSBs set per their type (e.g., command or data). The receiver may track the current node location and all navigation commands may thus be configured with respect to the current node. Alternatively, each navigation command may begin from a root node; in this case, the ascend command described below may be unnecessary.

The Ascend command specifies a number of levels to traverse (upward) in the hierarchical tree structure. The ascend command reverses the descent command by the specified number of levels. Since each child node in the tree only has one parent, no further specification may be needed.

The Modifier command specifies a value to apply to all parameters below the current location in the hierarchical structure. The Modifier command is a special command for specifying parameters on sections of the tree instead of at just one location. The first step to using a modifier command is to navigate to the desired node location in the tree using the Descend command. The Modifier is then applied by adding the Modifier command and associated fields after the Descend command. Modifiers can be inserted anywhere in the XCL commands, but may be most efficient when they are placed so that the navigation to specify a parameter(s) and the navigation to specify a Modifier are combined. Modifiers may also be most efficient when the treed data is arranged in such a way that parameters that can be set with common values are grouped together under the same node.

While this set of commands is one possible embodiment of an XCL, any number of other variations, such as the command set shown in FIG. 24, are also possible.

FIG. 17—XCL Command Set Modifiers

As described above, a Modifier command specifies that the data to follow includes a particular modifier and a one or more corresponding modifier values, which apply to the all nodes of the tree below the current node. FIG. 17 is a table enumerating and defining each of these modifiers according to one embodiment. Further explanation of each of these possible modifiers is given below.

A Subversion (or protocol generation) modifier specifies the protocol sub generation of the parameters specified on the nodes below the current one. This is the generation of a particular elementary subsystem. The protocol generation of the service as a whole may be specified by the root location of the tree navigated.

An Exception modifier specifies that data parameters on the nodes below the current one are exceptions to the most recent Modifier specified.

An Optional modifier specifies that any data parameters on the nodes below the current one are optional extensions. All parameters specified may be required unless noted otherwise with a Modifier command followed by an 'optional' data field applied to the node the parameter(s) reside on. This modifier may be useful to include optional components in a service, e.g., which may be of a different base protocol version than the service as a whole. This would allow legacy devices to use the service without the optional components, while newer receivers could use the (e.g., service enhancing) optional components.

A Replicate modifier specifies a hierarchical node to replicate at this location. That is, all parameters from the specified node may be copied to the current location.

One or more values may be reserved for future use, as well as a value for extending the modifier field, e.g., essentially allowing more modifiers to be defined even if all of the reserved values are used. In the embodiment shown, the 'extend field' value for a modifier is '1111'.

While FIG. 17 shows one possible set of command modifiers, any number of embodiments are possible; for example, an alternate embodiment is shown in FIG. 25.

Table A below illustrates XLC protocol fields and associated parameters.

TABLE A i. The XLC Protocol Field Definitions
XLC System Sub-Packet Definition

| ID | Field Name | Description |
| --- | --- | --- |
| 0.0 | Disable | Disables System |
| 0.1 | Physical | Controls Physical layer |
| 0.2 | Management | Controls Management layer |
| 0.3 | Presentation | Controls Presentation layer |
| 0.4 | Packet Control | Controls the Packet Control |
| 0.5 | Other | TBD |

Table B below illustrates physical definitions of XLC sub-packet IDs.

TABLE B

XLC Physical Sub-Packet ID
XLC Sub-Packet - Physical Definition

| ID | Field Name | Description |
| --- | --- | --- |
| 0.1.0 | Disable | Disables Physical |
| 0.1.1 | RF | Controls the RF layer |
| 0.1.2 | FEC | Controls the FEC parameters for a stream |

TABLE B-continued

XLC Physical Sub-Packet ID
XLC Sub-Packet - Physical Definition

| ID | Field Name | Description |
|---|---|---|
| 0.1.3 | MPEG-2 TS (legacy) | Controls the transport streams |
| 0.1.4 | Number of Streams | The number of streams being transmitted by the PHY |
| 0.1.5 | PHY Type | The default setting for the type of PHY |
| 0.1.6 | PHY State | Returns the current state of the PHY |
| 0.1.7 | Other | TBD |

Two different approaches were looked at to encode the robust or an augmented stream. One method would be to allow the user to specify an outer coding method, an interleaving method, and an inner coding method independently in a serial or parallel fashion. However, experience has shown that layered encoding strategies need to be developed from a systems perspective. In the coming age of software defined systems, this provides the most efficient practical implementation strategy as well as extensible infrastructure. Therefore, the type of system encoding are addressed at a system level in the following table, where the VSIW infrastructure supports a theoretical unlimited number of methodologies to take advantage of future breakthroughs in forward error correction techniques.

| ID | Encoding Type | Rate | Description |
|---|---|---|---|
| 0 | None | Full | The Data is not encoded with robust FEC |
| 1 | Turbo Code | ½ | Packet based Turbo Coding method |
| 2 | Turbo Code | ¼ | Packet based Turbo Coding method |
| 3 | LDPC | ½ | Packet based Low Density Parity Codes Coding method |
| 4 | LDPC | ¼ | Packet based Low Density Parity Codes Coding method |
| 5 | Turbo Codes + LDPC | ½ | Packet based Low Density Parity Codes + TC Coding LDPC method |
| 6 | Turbo Codes + LDPC | ¼ | Packet based Low Density Parity Codes + TC Coding LDPC method |
| 7 | Raptor | ½ | Packet based Digital Fountain + Tornado Coding method |
| 8 | Raptor | ¼ | Packet based Digital Fountain + Tornado Coding method |
| No-limit | Reserved | | Reserved for Future Expansion. |

In some embodiments, The PHY Type sets the value for all hierarchical sub-fields of the XLC Physical Layer parameters to a default mode. This offers a low bandwidth method for loading predefined defaults of a specific physical type. The number of PHY Types listed is not a theoretical limit by design.

In some embodiments, a Physical—RF—RFSPID field definition includes a Training Sequence field that defines a training sequence type. In some embodiments, a sub-packet includes a Training Sequence Field Definition.

In some embodiments, a Physical FEC type field supports values for None and LDPC.

The VSIW packet structure provides a management organization method or framework for transmission of the XLC protocol that enables real-time and dynamic configurability, flexibility, and extensibility of the system. The VSIW packet is designed to be configurable and extensible to support dynamic and future service capabilities. A common theme is that any system of this sort can be fully customized through its system layers so that delivery of services can use the most efficient protocol from physical through management through presentation layers, e.g. towards transmission, post- and pre-processing, power, and resource utilization. Intrinsically this framework supports extensibility to the system and thus provides for future technology innovations and adaptations based on un-anticipated service application. This protocol is intended to support variable physical encoding and modulation schemes that can vary in real-time during transmission.

Table C below illustrates a hierarchical view of the XLC protocol fields and associated parameters.

TABLE C

XLC Protocol - A Hierarchical View

Hierarchical View of Cross Layer Control (XLC) Field Dependencies

| Level-1 | Level-2 | Level-3 | Level-4 | Level-5 | Level-6 | Level-7 | Parameters |
|---|---|---|---|---|---|---|---|
| Physical | | | | | | | Enable/Disable |
| | PH1 RF | Training Sequence | | | | | Dep. on PHY Type TBD |
| | | Continuous or Burst Mode | | | | | Flag |
| | | Other | | | | | TBD |
| | PH2 FEC | Type | | | | | Dep. on PHY Type TBD |
| | | Rate | | | | | Dep. on PHY Type TBD |
| | | Interleaver Length | | | | | Dep. on PHY Type TBD |
| | | Other | | | | | TBD |
| | PH3 MPEG2-TS | Multiplexer Base | | | | | Length |
| | | Stream Multiplex Rate | | | | | Stream ID rate |
| | | Stream Multiplex Rate Incremental Update | | | | | Stream ID value |
| | | Other | | | | | TBD |

TABLE C-continued

XLC Protocol - A Hierarchical View

Hierarchical View of Cross Layer Control (XLC) Field Dependencies

| Level-1 | Level-2 | Level-3 | Level-4 | Level-5 | Level-6 | Level-7 | Parameters |
|---|---|---|---|---|---|---|---|
| | | Number of Streams | | | | | At least 1 |
| | | PHY Type | ATSC 1.0 | | | | Default |
| | | | A-VSB | | | | Default |
| | | | MPH | | | | Default |
| | | | Micro/Thom | | | | Default |
| | | | Other | | | | TBD |
| | | PHY States | Current Multiplexer State | | | | State |
| | | | Current Stream Interleaver State | | | | Stream ID |
| | | | | | | | State |
| | | | Current Location in Streams transport packet (Bytes) | | | | Stream ID |
| | | | | | | | State |
| | | | XLC Packet Offset | | | | Stream ID |
| | | | | | | | Offset |
| | | | Other | | | | TBD |
| | Other | | | | | | TBD |
| Management | | | | | | | Enable/Disable |
| | M1 Transport | | | | | | Enable/Disable |
| | | MPEG-2 TS | | | | | Enable/Disable |
| | | IP | | | | | Enable/Disable |
| | | UDP | | | | | Enable/Disable |
| | | Other | | | | | Enable/Disable |
| | M2 Signaling | | | | | | Enable/Disable |
| | | XML | | | | | Enable/Disable |
| | | SIP | | | | | Enable/Disable |
| | | SAP | | | | | Enable/Disable |
| | | SDP | | | | | Enable/Disable |
| | M3 Announcement | | | | | | Enable/Disable |
| | | ESG | | | | | Enable/Disable |
| | | EPG | | | | | Enable/Disable |
| | | Other | | | | | TBD |
| | M4 Streaming Delivery | | | | | | Enable/Disable |
| | | MPEG-2 | | | | | Enable/Disable |
| | | MPEG-4 | | | | | |
| | | Streaming | | | | | |
| | | TESLA-SRTP | | | | | Enable/Disable |
| | | SRTP | | | | | Enable/Disable |
| | | | Authenticate | | | | Enable/Disable |
| | | | | | HMAC-SHAI | | Enable/Disable |
| | | | | | Other | | TBD |
| | | | Encryption | | | | Enable/Disable |
| | | | | Cipher | | | Enable/Disable |
| | | | | | AES | | Enable/Disable |
| | | | | | | Counter Mode | Enable/Disable |
| | | | | | | Output Feedback | Enable/Disable |
| | | | | | | F8 Mode | Enable/Disable |
| | | | | | | Other | TBD |
| | | | | | Other | | TBD |
| | | | | Key Derivation | | | Enable/Disable |
| | | | | | Encry Keys | | Enable/Disable |
| | | | | | | ZRTP | Enable/Disable |
| | | | | | | Mikey | Enable/Disable |
| | | | | | | Other | TBD |
| | | | | | Auth Keys | | Enable/Disable |
| | | | | | | ZRTP | Enable/Disable |
| | | | | | | Mikey | Enable/Disable |
| | | | | | | Other | TBD |
| | | | | | Other | | TBD |
| | | | | Key Exchange | | | Enable/Disable |
| | | | | | SDES | | Enable/Disable |
| | | | | | Other | | TBD |
| | | | | Other | | | TBD |
| | | | Other | | | | TBD |
| | | Other | | | | | TBD |
| | M5 File Delivery | | | | | | Enable/Disable |
| | | FLUTE | | | | | Enable/Disable |
| | | | ALC | | | | Enable/Disable |
| | | | LCT | | | | Enable/Disable |
| | | | CC | | | | Enable/Disable |

TABLE C-continued

XLC Protocol - A Hierarchical View

Hierarchical View of Cross Layer Control (XLC) Field Dependencies

| Level-1 | Level-2 | Level-3 | Level-4 | Level-5 | Level-6 | Level-7 | Parameters |
|---|---|---|---|---|---|---|---|
| | | | FEC | | | | Enable/Disable |
| | | | Carousels | | | | Enable/Disable |
| | | | Other | | | | TBD |
| | | Other | | | | | TBD |
| | M6 Application | specifics defined under parts of M2, M3, M4, M7, & M8 as shown in the system layer diagram | | | | | Enable/Disable |
| | M7 CAS | | | | | | Enable/Disable |
| | | CA Scrambler | | | | | Enable/Disable |
| | | SAS | | | | | Enable/Disable |
| | | SMS, MMS | | | | | Enable/Disable |
| | | PPV | | | | | Enable/Disable |
| | | Other | | | | | TBD |
| | M8 DRM | | | | | | Enable/Disable |
| | | Scrambling | | | | | Enable/Disable |
| | | | CSS | | | | Enable/Disable |
| | | | Other | | | | TBD |
| | | Encryption | | | | | Enable/Disable |
| | | | Cipher | | | | Enable/Disable |
| | | | Key Derivation | | | | Enable/Disable |
| | | | Key Exchange | | | | Enable/Disable |
| | | | Other | | | | TBD |
| | | Content Protection | | | | | Enable/Disable |
| | | | PVP | | | | Enable/Disable |
| | | | AACS | | | | Enable/Disable |
| | | | Other | | | | TBD |
| | | Copy Control Method | | | | | Enable/Disable |
| | | | Copy Control | | | | Enable/Disable |
| | | | CDS | | | | Enable/Disable |
| | | | Watermarks | | | | Enable/Disable |
| | | | | | Method 1 | | Enable/Disable |
| | | | | | Method 2 | | Enable/Disable |
| | | | | | Other | | TBD |
| | | | Forward Lock | | | | Enable/Disable |
| | | | Separate Delivery | | | | Enable/Disable |
| | | | Other | | | | TBD |
| | | File Format | | | | | Enable/Disable |
| | | | Base64 | | | | Enable/Disable |
| | | | Binary | | | | Enable/Disable |
| | | | Other | | | | TBD |
| | | Other | | | | | TBD |
| | Other | | | | | | TBD |
| Presentation | | | | | | | Enable/Disable |
| | P1 Video Codecs | | | | | | Enable/Disable |
| | | MPEG-2 | | | | | Enable/Disable |
| | | MPEG-4 | | | | | Enable/Disable |
| | | Other | | | | | TBD |
| | P2 Audio Codecs | | | | | | Enable/Disable |
| | | AC-3 | | | | | Enable/Disable |
| | | Other | | | | | TBD |
| | P3 Captioning | | | | | | Enable/Disable |
| | P4 Graphic Elements | | | | | | Enable/Disable |
| | P5 Service Guide | | | | | | Enable/Disable |
| | Other | | | | | | TBD |
| Packet Control | | | | | | | Enable/Disable |
| | Checksum | | | | | | Enable/Disable |
| | | CRC-8 | | | | | $x^8 + x^2 + x^1 + 1$ |
| | | CRC-16 CCITT | | | | | $x^{16} + x^{12} + x^5 + 1$ |
| | | Check Type | | | | | TBD |
| | | Other | | | | | TBD |
| | Other | | | | | | TBD |
| Other | | | | | | | TBD |

Figure 18:
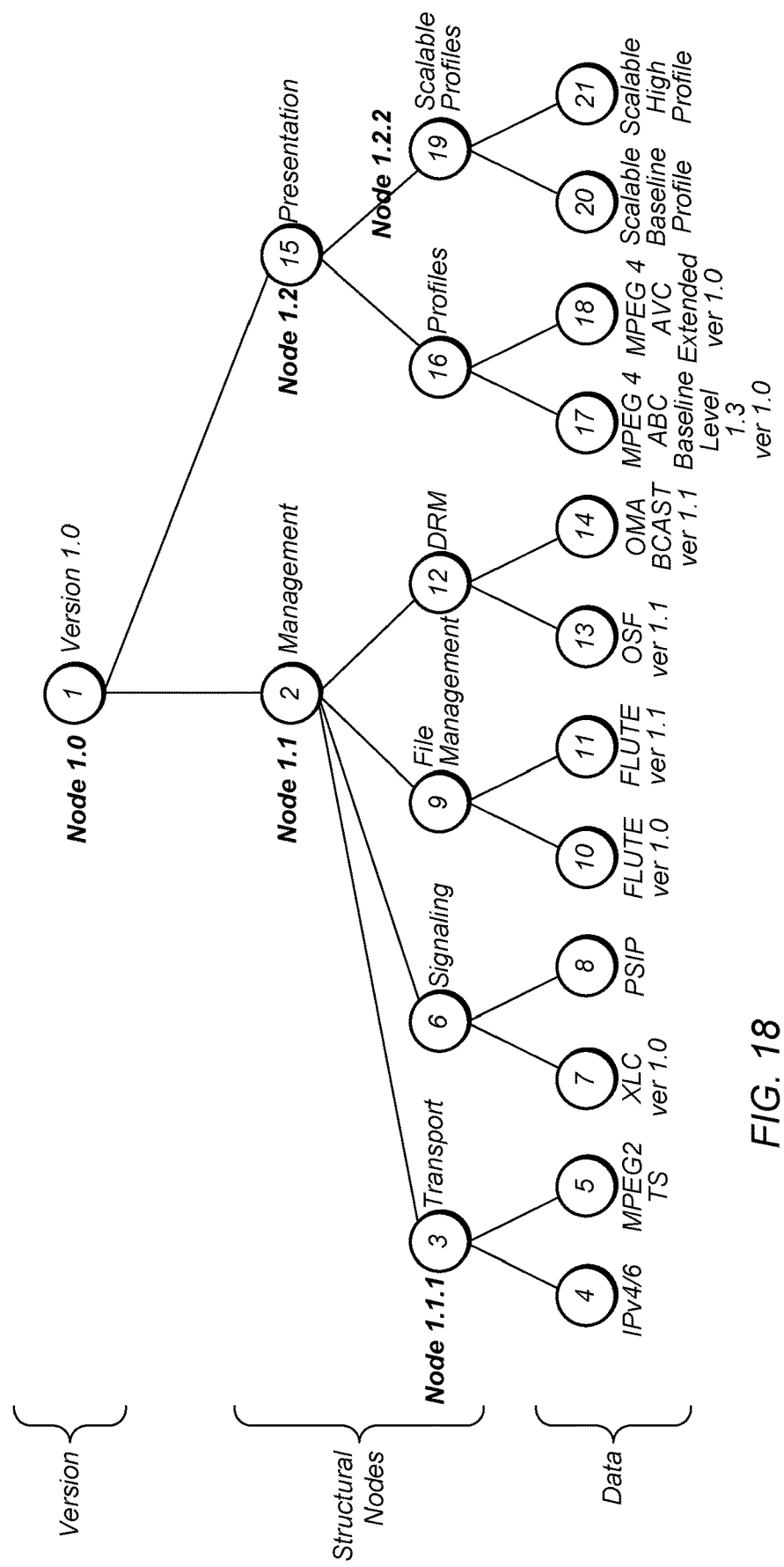
FIG. 18 is an illustration depicting part of an ATSC M/H tree according to one embodiment.

FIG. 18—ATSC M/H Tree

FIG. 18 illustrates a portion of a tree based version of an ATSC M/H protocol stack according to one embodiment. Using the commands described above, such a tree may be navigated, and versioning and parameter information may be provided, in a bit-efficient way.

Figure 19:
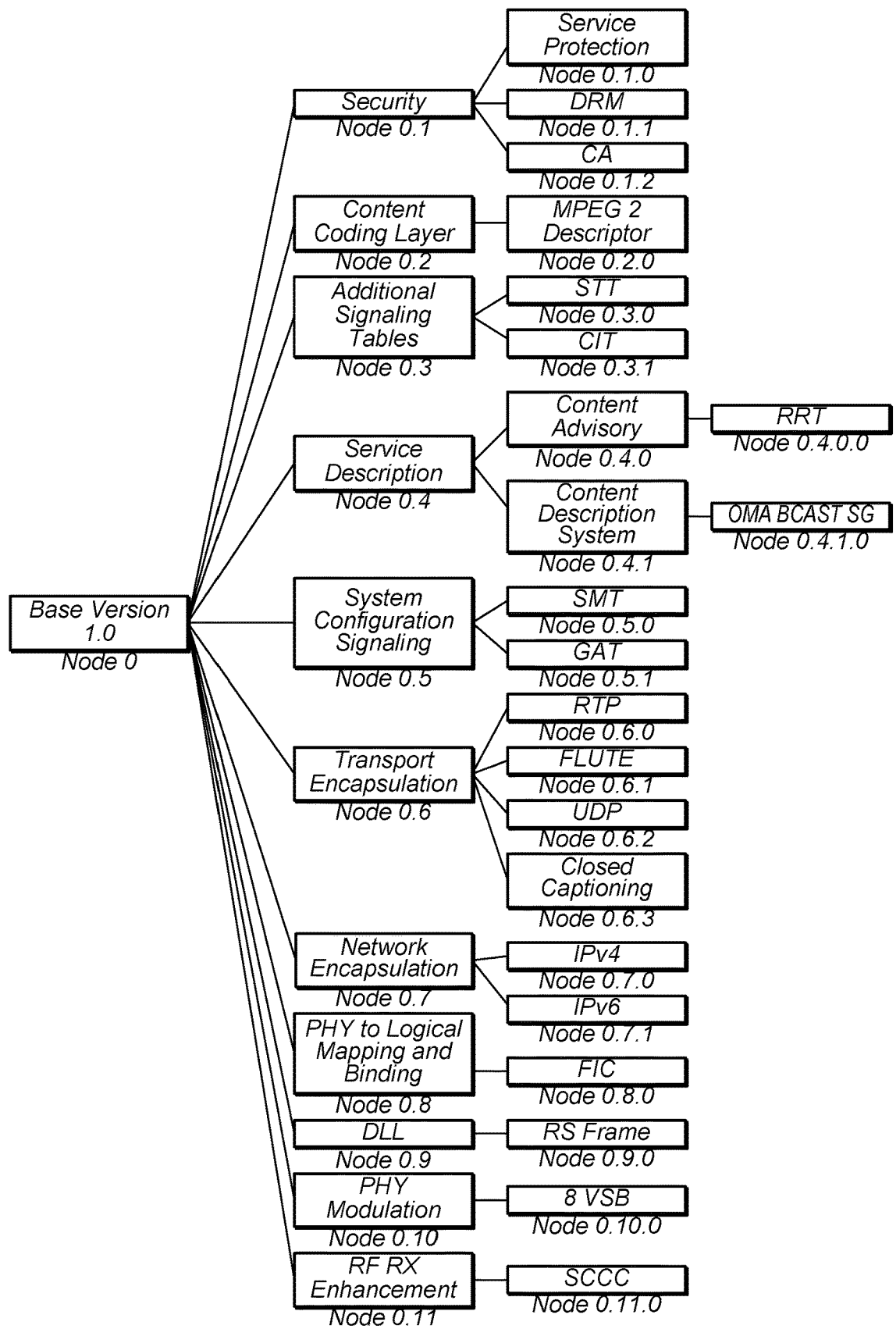
FIG. 19 is an illustration depicting an ATSC M/H tree according to one embodiment.

FIG. 19—ATSC M/H Tree

FIG. 19 illustrates another representation of an ATSC M/H tree. Note that the tree includes leaves for all of the System Configuration signaling 'tables', e.g., the FIC, SMT, CIT, STT, SLT, and GAT, such that these tables (or trees) may also be versioned. In some embodiments, such a tree may be arranged specifically in a manner as to take advantage of the command language (e.g., XCL) which will be used to encode it. For example, table data can be structured optimally to take full advantage of the XCL capabilities by minimizing the number of nodes needed, and maximizing the number of leaves at each node. This may minimize the navigation overhead. Depending on the command language used, certain rules may also apply to the construction of such a tree. For example, for the XCL embodiment described above, the following rules may apply:
1) Nodes are for navigation only and do not contain parameters (data).
2) A new node can only be added to another node (not to a leaf)
3) Nodes are placed in locations of the tree where future parameters may need to be added.
4) Parameters are located at leaves. Leaves are locations at the termination points of nodes.

These rules are exemplary only, and thus it will be noted that, depending on the command set used, a different set of rules may be essential or helpful in improving the efficiency of the signaling framework.

In some embodiments, a given tree (e.g., an FIC tree) may typically be defined once per protocol generation. Subsequent additions and subtractions to the table may be implemented as amendments to the original tree, maintaining the order, so that the location in the tree communicates information (e.g., trees descending from node 0 are always a first protocol generation service.)

When constructing the signaling structure for the data, the extent to which the data is treed controls the flexibility and extensibility of the data. For maximum flexibility, each parameter can be located on a separate leaf (e.g., fully resolving a tree). Alternatively, a more efficient signaling structure can be achieved through grouping parameters at each leaf (e.g., partially resolving a tree).

FIG. 20—FIC Tree

Figure 20:
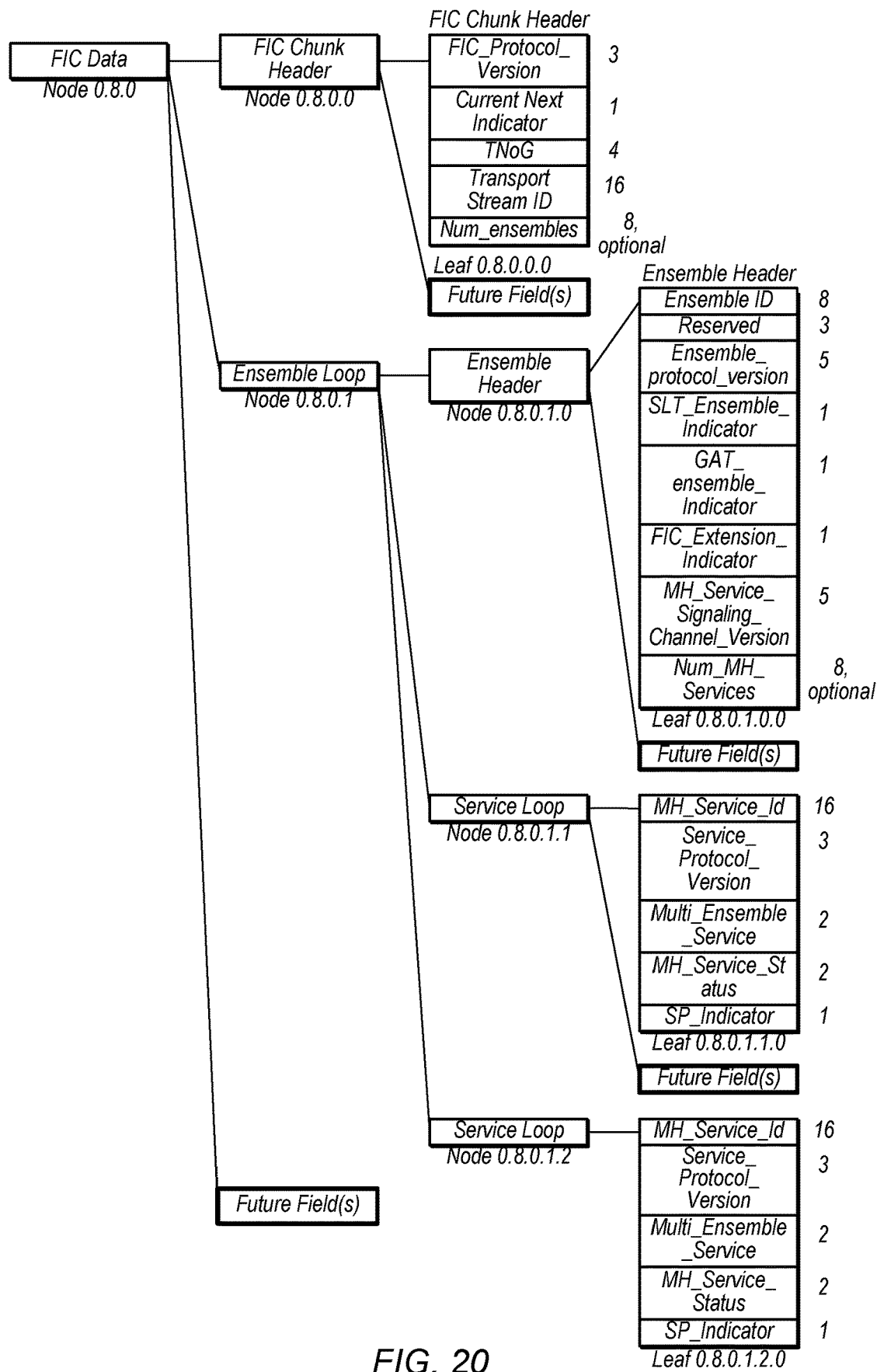
FIG. 20 is an illustration depicting a FIC data tree for use with the ATSC M/H tree in FIG. 19 according to one embodiment.

FIG. 20 illustrates a partially resolved tree representation of the FIC, including hypothetical nodes for future extension of the tree at each node. This tree could be used in combination with the tree of FIG. 19 (e.g., the FIC root node is node 0.8.0 in the system configuration tree shown in FIG. 19). For example, the tree as shown but without the "Future Field(s)" could be the version 1.0 FIC tree. A version 1.1 FIC tree might include one or more additional fields where one or more of the "Future Field(s)" are shown. In this case, the additional nodes and/or leaves might be version 1.1, while the original nodes and leaves might remain 1.0. A version 2.0 FIC tree could have an entirely different structure, e.g., be rearranged, or include different fields.

Figure 21:
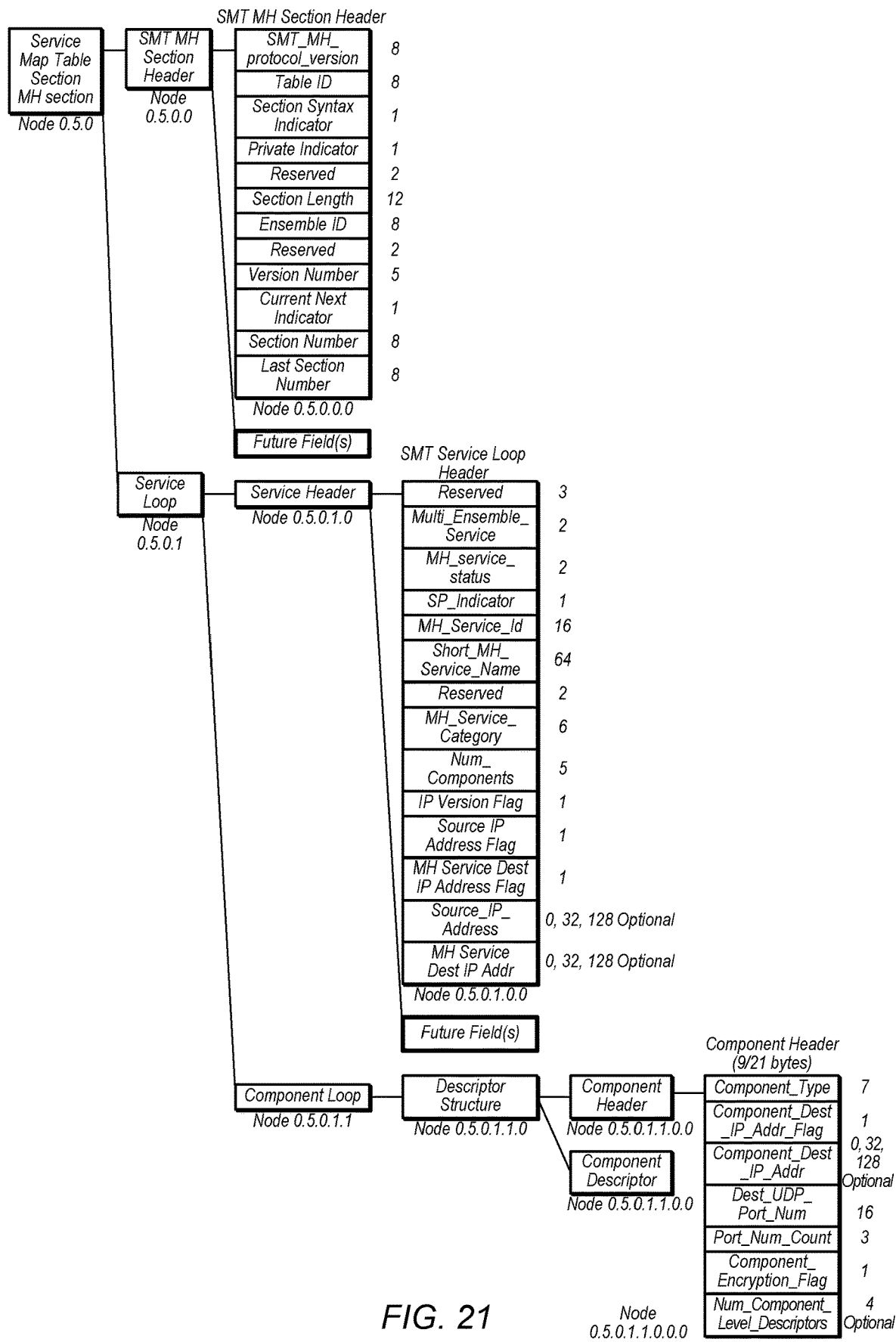
FIG. 21 is an illustration depicting an exemplary command sequence navigating a FIC tree according to one embodiment.

FIG. 21—Exemplary Coding of a FIC Tree

FIG. 21 shows an exemplary coding of a portion of the FIC table shown in FIG. 20 according to the XCL embodiment described above with respect to FIGS. 15-17. FIG. 21 just shows the command/data portion of a control packet (e.g., the control information); it should be noted that in some embodiments this may be only a portion of a control packet that also includes other fields (e.g., packet header, length, etc., such as described in FIG. 10)

FIG. 22—SMT Tree

FIG. 22 illustrates a partially resolved tree representation of the SMT, including hypothetical nodes for future extension of the tree at each node. This tree could be used in combination with the tree of FIG. 19 (e.g., the SMT root node is node 0.5.0 in the system configuration tree shown in FIG. 19). For example, the tree as shown but without the "Future Field(s)" could be the version 1.0 SMT tree. A version 1.1 SMT tree might include one or more additional fields where one or more of the "Future Field(s)" are shown. In this case, the additional nodes and/or leaves might be version 1.1, while the original nodes and leaves might remain 1.0. A version 2.0 SMT tree could have an entirely different structure, e.g., be rearranged, or include different fields.

FIG. 23—Exemplary Coding of an SMT Tree

FIG. 23 shows an exemplary coding of a portion of the SMT table shown in FIG. 22 according to the XCL embodiment described above with respect to FIGS. 15-17. The code shown in FIG. 23 may be part of a larger control packet, as indicated by the 'header', 'length', 'fragment number', and 'service descriptor' fields shown at the top of FIG. 23.

FIGS. 24 and 25—Alternate Embodiments of XCL Commands

Figure 26:
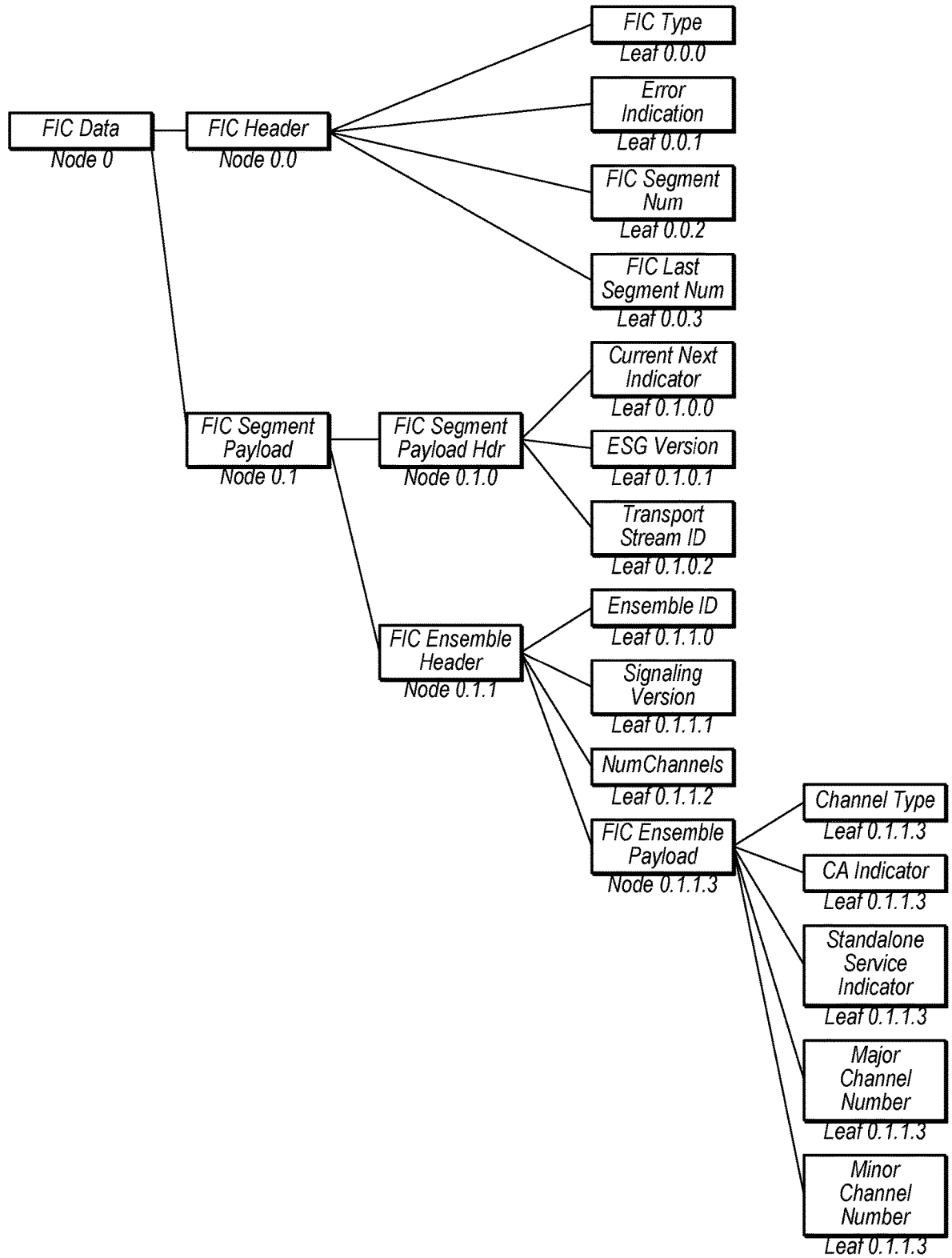
FIGS. 26-28 are illustrations depicting alternate embodiments of FIC and SMT data trees.
Figure 27:
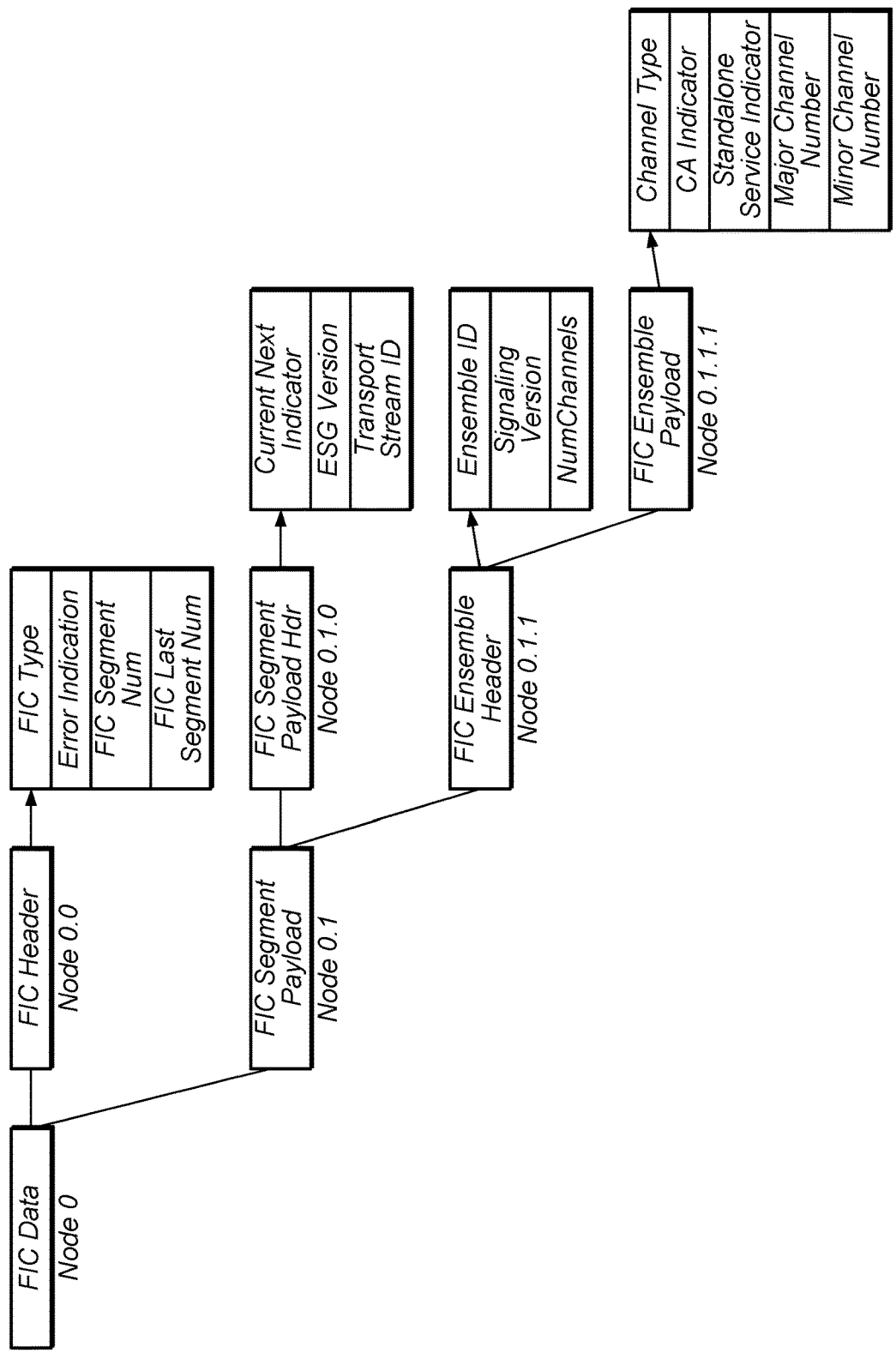
Figure 28:
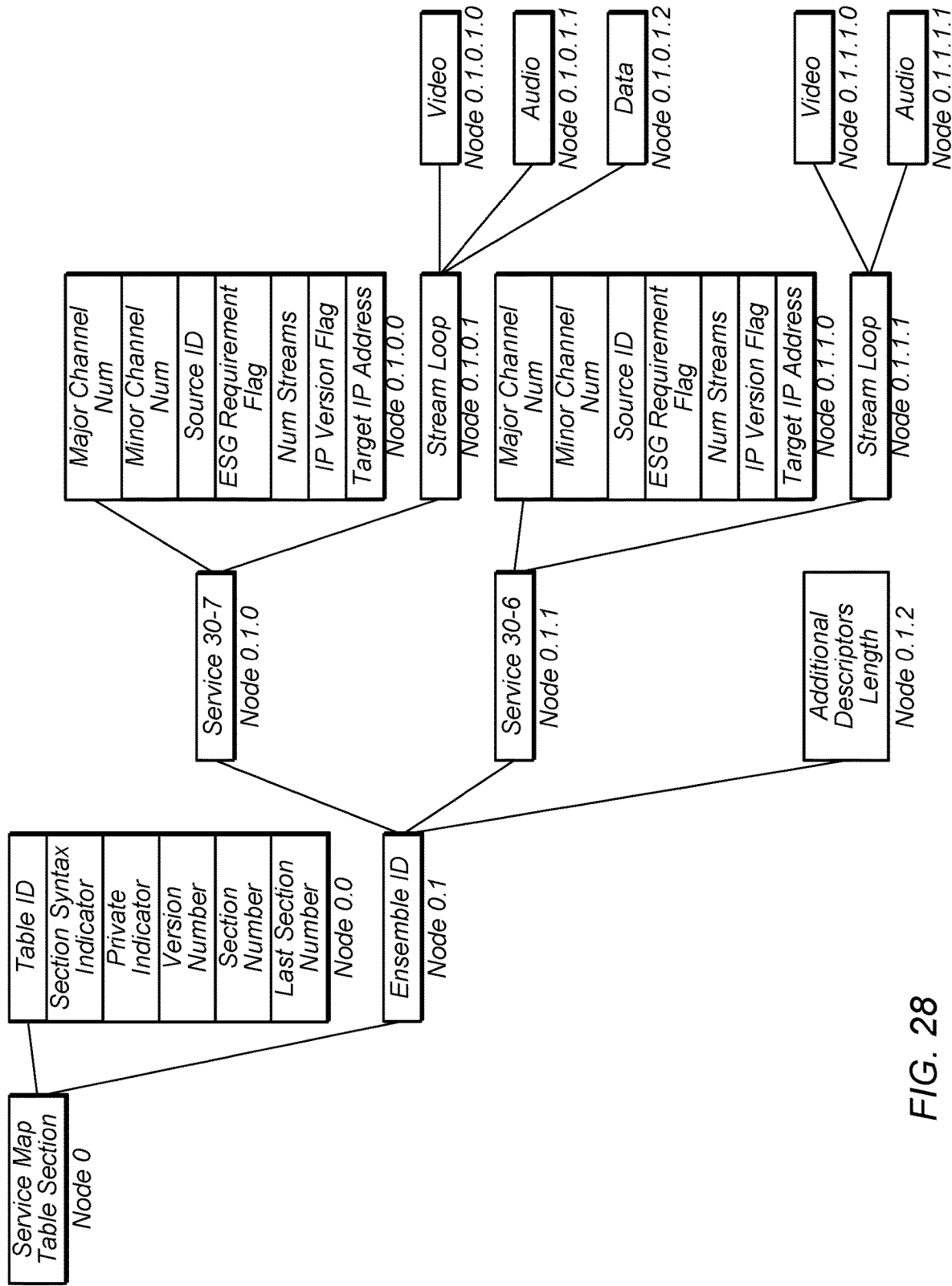

FIGS. 24 and 25 show alternate embodiments of the XCL commands and command modifiers respectively. Thus, while the XCL shown and described with respect to FIGS. 15-17 may be one embodiment of a command set for encoding tree based information, the set shown in FIGS. 24 and 25, or any such command set, may alternatively be used as desired as a flexible, extensible method of encoding tree based information in a very bit efficient way FIGS. 26-28—Alternate Embodiments of FIC and SMT Data Trees FIGS. 26-28 show several alternate embodiments of data trees. FIG. 26 shows a fully resolved tree representation of the FIC according to one embodiment. Fully resolving a data tree maximizes flexibility and extensibility of the tree, and redundancy can still be effectively exploited with the 'replicate' command modifier to minimize the additional navigation overhead incurred by fully resolving the tree.

Alternatively, instead of fully resolving a tree, it is also possible to partially resolve a tree, as shown in FIG. 27. In this way, groups of leaves which are similar or likely to be modified at the same time or in the same way may be used to reduce the overhead involved in navigating the tree. However, this limits the flexibility and extensibility of the tree, and the groupings must be well designed to anticipate which leaves are likely to change at the same time and in the same ways.

FIG. 28 shows an alternate embodiment of a partially resolved SMT data tree.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. An apparatus configured to decode a wirelessly received data stream, comprising:
   one or more processors; and
   one or more memories having program instructions stored thereon that are executable by the one or more processors to:
      receive one or more first frames of wireless data that include: first data, first control information, and a first plurality of packets, wherein said first data includes one or more first physical layer parameters;
      determine a physical layer structure of the first control information based on the first data;
      decode the first control information based on the determined structure of the first control information;
      decode the first plurality of packets based on the first control information;
      receive one or more second frames of wireless data that include: second data, second control information, and a second plurality of packets, wherein said second data includes one or more second physical layer parameters having one or more different values than said one or more first physical layer parameters;

determine a physical layer structure of the second control information based on the second data, wherein the physical layer structure of the second control information is different than a physical layer structure of the first control information;

decode the second control information based on the determined structure of the second control information; and decode the second plurality of packets based on the second control information.

2. The apparatus of claim 1, wherein the first data indicates a location of the first control information.

3. The apparatus of claim 1, wherein a location of the first data within the one or more first frames and a location of the second data within the one or more second frames is the same.

4. The apparatus of claim 1, wherein the first data is separate from the first control information and the second data is separate from the second control information.

5. The apparatus of claim 1, wherein the one or more processors are further configured to determine that the apparatus supports the second control information, based on the second data.

6. The apparatus of claim 1, wherein said first data and said second data each comprise a respective protocol version parameter.

7. The apparatus of claim 1, wherein said one or more first physical layer parameters indicate the modulation and length of said first control information, and wherein said one or more second physical layer parameter indicate the modulation and length of said second control information.

8. The apparatus of claim 1, wherein said one or more first physical layer parameters and one or more second one or more first physical layer parameters respectively indicate forward error correction type.

9. The apparatus of claim 1, wherein said first control information indicates at least one of:
a code rate for the data stream;
interleaving length; or
a parameter for low density parity check (LDPC) encoding.

10. The apparatus of claim 1, wherein said first physical layer parameter specifies a training data characteristic for the first control information.

11. The apparatus of claim 1, wherein the structure of said second control information includes one or more fields not included in said first control information.

12. The apparatus of claim 1, wherein the structure of said second control information omits one or more fields in said first control information.

13. A non-transitory computer-readable medium having instructions stored thereon that are executable by a computing device to perform operations comprising:
receiving one or more first frames of wireless data that include: first data, first control information, and a first plurality of packets, wherein said first data includes one or more first physical layer parameters;
determining a physical layer structure of the first control information based on the first data;
decoding the first control information based on the determined structure of the first control information;
decoding the first plurality of packets based on the first control information;
receiving one or more second frames of wireless data that include: second data, second control information, and a second plurality of packets, wherein said second data includes one or more second physical layer parameters having one or more different values than said one or more first physical layer parameters;
determining a physical layer structure of the second control information based on the second data, wherein the physical layer structure of the second control information is different than a physical layer structure of the first control information;
decoding the second control information based on the determined structure of the second control information; and
decoding the second plurality of packets based on the second control information.

14. The non-transitory computer-readable medium of claim 13, wherein the first data indicates a location of the first control information.

15. The non-transitory computer-readable medium of claim 13, wherein the operations further comprise determining that the computing device supports the second control information, based on the second data.

16. The non-transitory computer-readable medium of claim 13, wherein said first data and said second data each comprise a respective protocol version parameter.

17. The non-transitory computer-readable medium of claim 13, wherein said one or more first physical layer parameters indicate the modulation and length of said first control information, and wherein said one or more second physical layer parameter indicate the modulation and length of said second control information.

18. The non-transitory computer-readable medium of claim 13, wherein said one or more first physical layer parameters and one or more second one or more first physical layer parameters respectively indicate forward error correction type.

19. The non-transitory computer-readable medium of claim 13, wherein said first control information indicates at least one of:
a code rate for the data stream;
interleaving length; or
a parameter for low density parity check (LDPC) encoding.

20. A method, comprising:
receiving, by a computing device, one or more first frames of wireless data that include: first data, first control information, and a first plurality of packets, wherein said first data includes one or more first physical layer parameters;
determining, by the computing device, a physical layer structure of the first control information based on the first data;
decoding, by the computing device, the first control information based on the determined structure of the first control information;
decoding, by the computing device, the first plurality of packets based on the first control information;
receiving, by the computing device, one or more second frames of wireless data that include: second data, second control information, and a second plurality of packets, wherein said second data includes one or more second physical layer parameters having one or more different values than said one or more first physical layer parameters;
determining, by the computing device, a physical layer structure of the second control information based on the second data, wherein the physical layer structure of the second control information is different than a physical layer structure of the first control information;

decoding, by the computing device, the second control information based on the determined structure of the second control information; and decoding, by the computing device, the second plurality of packets based on the second control information.

\* \* \* \* \*